(12) United States Patent
Moon

(10) Patent No.: US 12,067,800 B2
(45) Date of Patent: *Aug. 20, 2024

(54) INPUT SENSING CIRCUIT AND DISPLAY MODULE HAVING THE SAME

(71) Applicant: Samsung Display Co., Ltd., Yongin-si (KR)

(72) Inventor: Sungjae Moon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,437

(22) Filed: Jan. 10, 2023

(65) Prior Publication Data

US 2023/0162523 A1 May 25, 2023

Related U.S. Application Data

(63) Continuation of application No. 15/888,067, filed on Feb. 4, 2018, now Pat. No. 11,568,668.

(30) Foreign Application Priority Data

May 15, 2017 (KR) .......................... 10-2017-0060155

(51) Int. Cl.
*G06V 40/13* (2022.01)
*G06F 3/041* (2006.01)
(Continued)

(52) U.S. Cl.
CPC ........ *G06V 40/1306* (2022.01); *G06F 3/0412* (2013.01); *G06F 3/04166* (2019.05); *G06F 3/0446* (2019.05); *G06V 40/1376* (2022.01); *G09G 3/3225* (2013.01); *G09G 2300/0426* (2013.01); *G09G 2300/0452* (2013.01);
(Continued)

(58) Field of Classification Search
None
See application file for complete search history.

(56) References Cited

U.S. PATENT DOCUMENTS

| 8,766,651 B2 | 7/2014 | Kang et al. |
| 9,268,440 B2 | 2/2016 | Ahn et al. |

(Continued)

FOREIGN PATENT DOCUMENTS

| KR | 10-2014-0041203 | 4/2014 |
| KR | 101376228 | 4/2014 |

(Continued)

OTHER PUBLICATIONS

Non-Final Office Action dated Nov. 13, 2020, issued to U.S. Appl. No. 15/888,067.

(Continued)

*Primary Examiner* — Benjamin X Casarez
(74) *Attorney, Agent, or Firm* — Lewis Roca Rothgerber Christie LLP

(57) ABSTRACT

An input sensing circuit includes a plurality of sensors to sense a touch event and to recognize a fingerprint. Among the sensors, at least one sensor includes two transistors and one capacitor. One electrode of electrodes of the capacitor makes contact with a finger of a person to form a capacitance, and the input sensing circuit senses the capacitance to sense the touch event and to recognize the fingerprint.

13 Claims, 19 Drawing Sheets

(51) Int. Cl.
  *G06F 3/044* (2006.01)
  *G06V 40/12* (2022.01)
  *G09G 3/3225* (2016.01)
  *H10K 59/12* (2023.01)
  *H10K 59/35* (2023.01)
  *H10K 59/40* (2023.01)

(52) U.S. Cl.
  CPC ........... *H10K 59/12* (2023.02); *H10K 59/352* (2023.02); *H10K 59/40* (2023.02)

(56) References Cited

U.S. PATENT DOCUMENTS

| | | | |
|---|---|---|---|
| 9,395,835 | B2 | 7/2016 | No et al. |
| 10,037,452 | B2 | 7/2018 | Han et al. |
| 10,210,373 | B2 | 2/2019 | Kim et al. |
| 10,804,337 | B2 | 10/2020 | Jang et al. |
| 11,568,668 | B2 * | 1/2023 | Moon ................... G06F 3/0446 |
| 2005/0077911 | A1 | 4/2005 | Miyasaka |
| 2005/0110421 | A1 * | 5/2005 | Matsumoto .......... G09G 3/3225 345/55 |
| 2007/0024546 | A1 | 2/2007 | Jang et al. |
| 2009/0135158 | A1 | 5/2009 | Takahashi et al. |
| 2010/0144391 | A1 | 6/2010 | Chang et al. |
| 2010/0149128 | A1 | 6/2010 | No et al. |
| 2010/0156819 | A1 | 6/2010 | Takahashi et al. |
| 2011/0198484 | A1 | 8/2011 | Kurokawa |
| 2014/0055685 | A1 | 2/2014 | Wang et al. |
| 2014/0266262 | A1 | 9/2014 | Taghibakhsh |
| 2016/0132713 | A1 | 5/2016 | Bae et al. |
| 2016/0202814 | A1 | 7/2016 | Lee et al. |
| 2017/0160853 | A1 | 6/2017 | Ishizaki et al. |
| 2017/0228573 | A1 | 8/2017 | Shen et al. |
| 2017/0351364 | A1 | 12/2017 | Kim et al. |
| 2018/0011601 | A1 | 1/2018 | Kurasawa et al. |
| 2018/0097039 | A1 | 4/2018 | Jeong et al. |

FOREIGN PATENT DOCUMENTS

| | | |
|---|---|---|
| KR | 20160057324 | 5/2016 |
| KR | 20170039050 | 4/2017 |

OTHER PUBLICATIONS

Final Office Action dated Apr. 1, 2021, issued to U.S. Appl. No. 15/888,067.

Non-Final Office Action dated Sep. 1, 2021, issued to U.S. Appl. No. 15/888,067.

Final Office Action dated Dec. 24, 2021, issued to U.S. Appl. No. 15/888,067.

Non-Final Office Action dated Apr. 13, 2022, issued to U.S. Appl. No. 15/888,067.

Notice of Allowance dated Sep. 28, 2022, issued to U.S. Appl. No. 15/888,067.

* cited by examiner

INPUT SENSING CIRCUIT AND DISPLAY MODULE HAVING THE SAME

CROSS-REFERENCE TO RELATED APPLICATIONS

This application is a Continuation of U.S. patent application Ser. No. 15/888,067, filed on Feb. 4, 2018, which claims priority from and the benefit of Korean Patent Application No. 10-2017-0060155, filed on May 15, 2007, which is hereby incorporated by reference for all purposes as if fully set forth herein.

BACKGROUND

Field

The invention relates generally to an input sensing circuit, and more particularly, to an input sensing circuit capable of recognizing a fingerprint of a user and a display module having the same.

Discussion of the Background

A display device can recognize a finger of a person who touches a screen using an input sensing circuit. There are a variety of touch sensing methods carried out by the input sensing circuit, such as a resistive film type touch sensing method, an optical type touch sensing method, an electrostatic capacitive type touch sensing method, an acoustic wave type touch sensing method, etc. Among the touch sensing methods, the electrostatic capacitive type touch sensing method senses a touch event occurring on the screen based on an electrostatic capacitance that varies when a touch generating unit such as a finger or a stylus makes contact with the screen of the display device.

In recent years, interest in the security of personal mobile devices, e.g., a smartphone, a tablet PC, etc., has increased as security issues have arisen. Particularly, as the user frequently uses the mobile devices for e-commerce security is required for the mobile devices. As the demands for the security of the mobile devices have increased, biometric information, like a fingerprint, have been used to authenticate users.

The above information disclosed in this Background section is only for enhancement of understanding of the background of the inventive concepts, and, therefore, it may contain information that does not constitute prior art.

SUMMARY

Input sensing circuits constructed according to the principles and illustrative embodiments of the invention and display modules having the same are capable of recognizing fingerprints more efficiently than conventional devices. For example, input sensing circuits and display modules constructed according to the principles and illustrative embodiments of the invention may improve the visibility of the image displayed through the display device without impairing the ability to recognize the user's fingerprint.

Additional aspects will be set forth in the detailed description which follows, and, in part, will be apparent from the disclosure, or may be learned by practice of the inventive concepts.

According to one aspect of the invention, a display module includes a display panel and a circuit. The display panel has a first light emitting area to emit first light having a first wavelength, a second light emitting area to emit second light having a second wavelength greater than the first wavelength, and a third light emitting area to emit third light having a third wavelength greater than the second wavelength, and the circuit configured to sense input signals said circuit having a first scan line, a second scan line, a readout line, and a sensor. The sensor includes a first transistor, a second transistor, a first electrode, and a transparent electrode. The first transistor has a first input electrode configured to receive a power source voltage, a first output electrode connected to the readout line, and a first control electrode. The second transistor has a second input electrode configured to receive an initialization voltage, a second output electrode connected to the first control electrode of the first transistor, and a second control electrode connected to the second scan line. The first electrode is connected to the first scan line. The transparent electrode overlaps with the first electrode, the first light emitting area, the second light emitting area, and the third light emitting area and is connected to the first control electrode of the first transistor.

The transparent electrode may include a second electrode overlapping the first electrode and a third electrode overlapping the first, second, and third light emitting areas, and the circuit may further include a reference capacitor including the first electrode and the second electrode.

The third electrode may be configured to form a capacitance with an external object.

The transparent electrode may be configured to form a capacitance with a fingerprint of a finger.

The sensor may be provided in a plural number. The transparent electrode of one sensor among the sensors may form a first capacitance with a ridge of the fingerprint and the transparent electrode of another sensor among the sensors may form a second capacitance with a valley of the fingerprint. The circuit may be configured to sense the first capacitance and the second capacitance and to output a signal to recognize the fingerprint.

A first scan signal may be applied to the first scan line during a first period, and a second scan signal may be applied to the second scan line during a second period. The second period may be a period after the first period.

The first electrode may be disposed closer to the first light emitting area than the second light emitting area and the third light emitting area.

The input sensing circuit may further include a scan driving circuit connected to the first scan line and the second scan line.

The display module further may include an anti-reflection member disposed between the display panel and the input sensing circuit. The anti-reflection member may be a polarizing member.

At least one of the first scan line, the second scan line, and the readout line may extend in a zigzag shape.

The first light is a blue light, the second light may be a green light, and the third light is a red light.

According to another aspect of the invention, an input sensing circuit includes a plurality of scan lines, a readout line intersecting the scan lines, a power line intersecting the scan lines, and a plurality of sensors connected to the scan lines, the readout line, and the power line. At least one sensor of the sensors includes a first transistor, a reference capacitor, a second transistor, and a third electrode. The first transistor has a first input electrode connected to the power line, a first output electrode connected to the readout line, and a first control electrode and being disposed between the readout line and the power line in the form of a single transistor. The reference capacitor has a first electrode connected to a first scan line among the scan lines and a second electrode connected to the first control electrode of the first transistor. The second transistor has a second input electrode configured to receive an initialization voltage, a second output electrode connected to the first control electrode of the first transistor, and a second control electrode connected to one of the second scan lines among the scan lines. The third electrode is connected to the first control electrode of the first transistor.

The second electrode and the third electrode may be disposed on a same layer.

The second electrode and the third electrode may include at least one of indium tin oxide, indium zinc oxide, zinc oxide, and indium tin zinc oxide.

The third electrode may be configured to form a capacitance with an external object.

The external object may be a fingerprint of a person.

The third electrode of one of the sensors may be configured to form a first capacitance with a ridge of the fingerprint, the third electrode of another one of the sensors may be configured to form a second capacitance with a valley of the fingerprint, and the input sensing circuit may be configured to sense the first capacitance and the second capacitance to output a signal to recognize the fingerprint.

The first scan signal may be applied to the first scan line during a first period, and a second scan signal may be applied to the second scan line during a second period.

Input sensing circuits and display modules constructed according to the principles and illustrative embodiments of the invention may improve the visibility of the image displayed through the display device without impairing the ability to recognize the user's fingerprint.

According to still another aspect of the invention, a display module includes: a display panel having a plurality of light emitting areas, each of the light emitting areas including a first light emitting area to emit first light having a first wavelength, a second light emitting area to emit second light having a second wavelength greater than the first wavelength, and a third light emitting area to emit third light having a third wavelength greater than the second wavelength; and a circuit disposed on the display panel and configured to sense input signals, said circuit having a first scan line, a second scan line, a readout line, and a sensor, the sensor including: a first transistor having a first input electrode to receive a power source voltage, a first output electrode connected to the readout line, and a first control electrode connected to a first node; a second transistor having a second input electrode configured to receive an initialization voltage, a second output electrode connected to the first node, and a second control electrode connected to the second scan line; a first electrode connected to the first scan line and spaced apart from the first light emitting areas, the second light emitting areas, and the third light emitting areas; and a transparent electrode comprising a first portion overlapped with the first electrode to form a reference capacitor and a second portion connected to the first node, wherein the second portion of the transparent electrode overlaps with at least two of the light emitting areas, and wherein the first scan line and second scan line extend in a zigzag shape, the first electrode is branched from the first scan line to have the zigzag shape.

The transparent electrode may include a second electrode overlapping the first electrode and a third electrode overlapping the first, second, and third light emitting areas, and the circuit may further include a reference capacitor including the first electrode and the second electrode.

The third electrode may be configured to form a capacitance with an external object.

The transparent electrode may be configured to form a capacitance with a fingerprint of a finger.

The sensor may be provided in a plural number, the transparent electrode of one sensor among the sensors may form a first capacitance with a ridge of the fingerprint, the transparent electrode of another sensor among the sensors may form a second capacitance with a valley of the fingerprint, and the circuit may be configured to sense the first capacitance and the second capacitance and to output a signal to recognize the fingerprint.

A first scan signal may be applied to the first scan line during a first period, and a second scan signal may be applied to the second scan line during a second period.

The second period may be a period after the first period.

The first electrode may be disposed closer to the first light emitting area than the second light emitting area and the third light emitting area.

The display module may further include a scan driving circuit connected to the first scan line and the second scan line.

The display module may further include an anti-reflection member disposed between the display panel and the input sensing circuit.

The anti-reflection member may be a polarizing member.

The readout line may extend in the zigzag shape.

The first light may be a blue light, the second light may be a green light, and the third light may be a red light.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF THE ILLUSTRATED EMBODIMENTS

Figure 1:
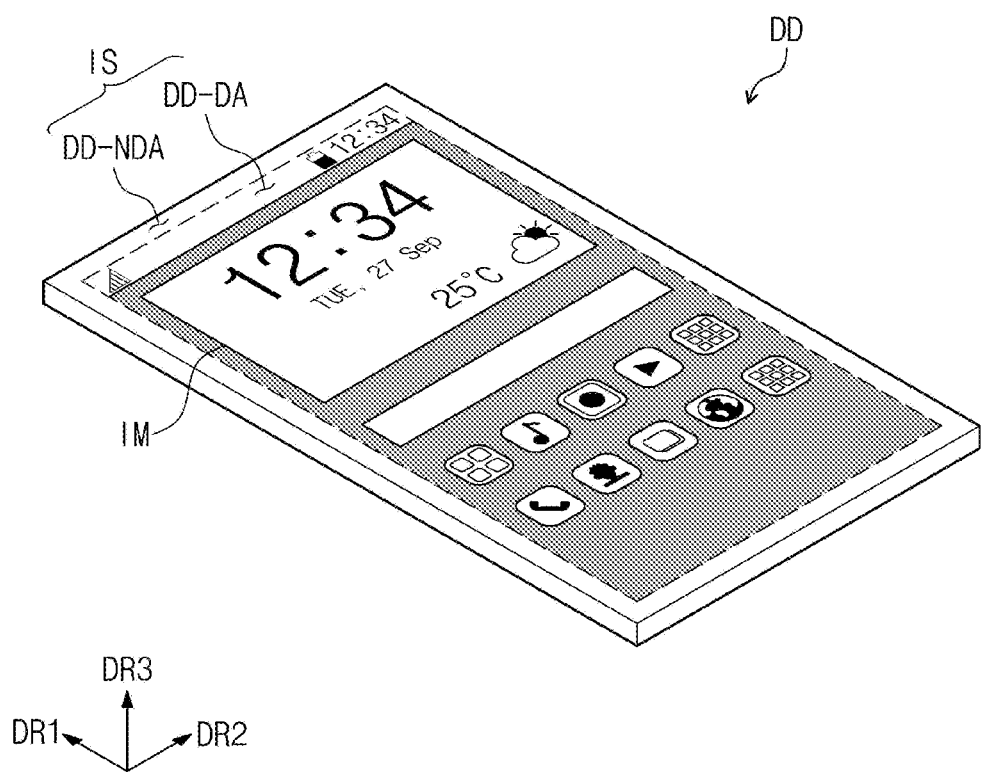
FIG. 1 is a perspective view of an embodiment of a display device constructed according to the principles of the invention.

In the following description, for the purposes of explanation, numerous specific details are set forth in order to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Unless otherwise specified, the illustrated embodiments are to be understood as providing features of varying detail of various embodiments. Therefore, unless otherwise specified, the features, components, modules, layers, films, panels, regions, and/or aspects of the various illustrations may be otherwise combined, separated, interchanged, and/or rearranged without departing from the disclosed embodiments. Further, in the accompanying figures, the size and relative sizes of layers, films, panels, regions, etc., may be exaggerated for clarity and descriptive purposes. When an embodiment may be implemented differently, a specific process order may be performed differently from the described order. For example, two consecutively described processes may be performed substantially at the same time or performed in an order opposite to the described order. Also, like reference numerals denote like elements When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
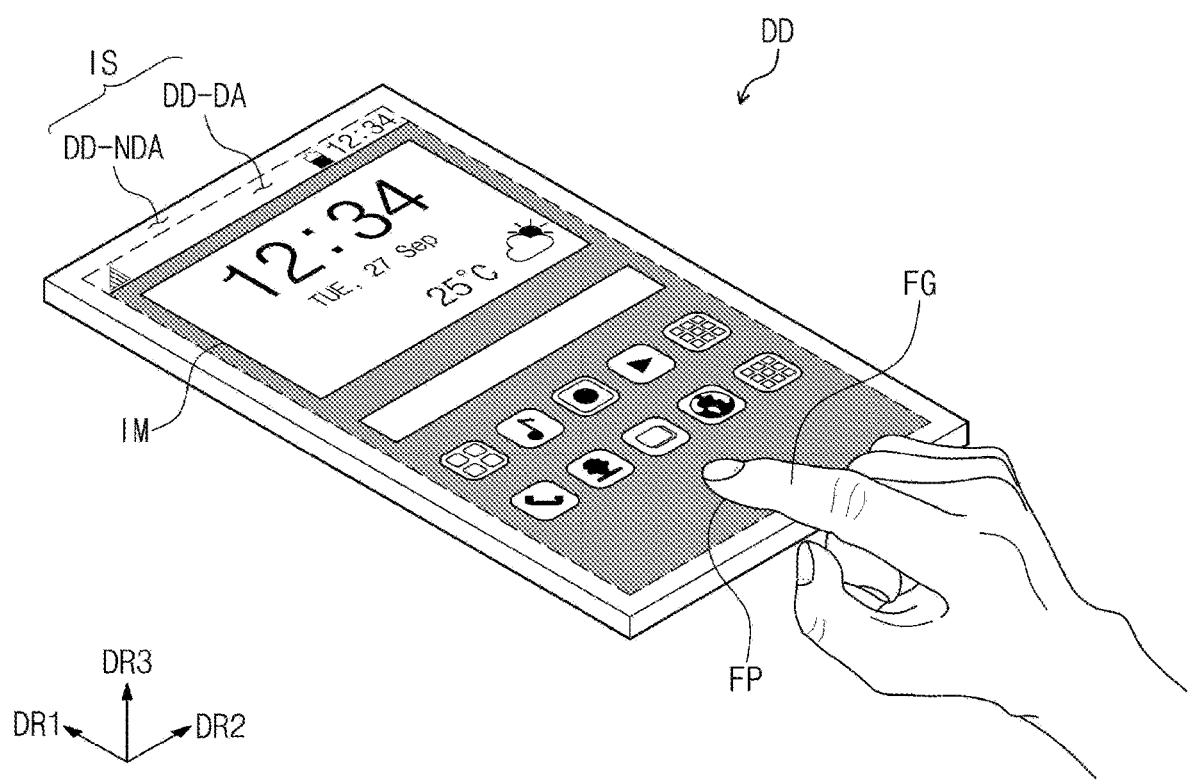
FIGS. 2A and 2B are perspective views showing a user's finger making contact with the display device shown in FIG. 1.
Figure 2B:
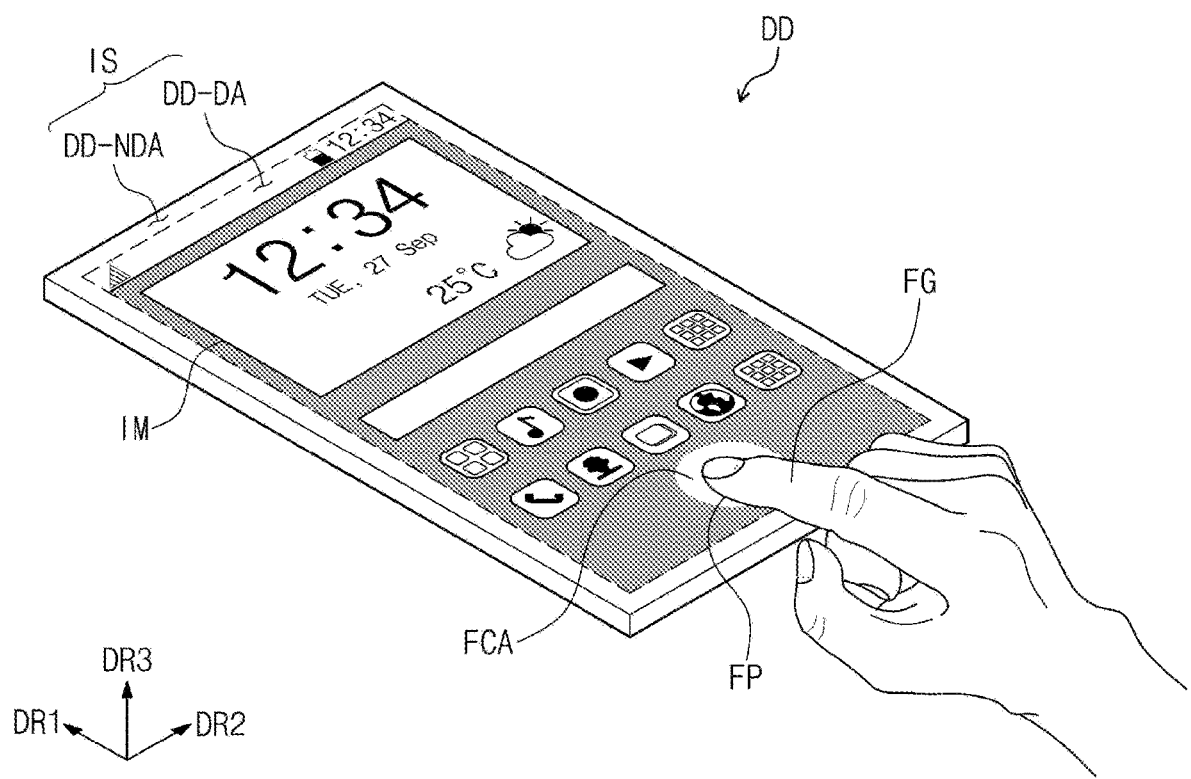

FIG. 1 is a perspective view of an embodiment of a display device DD according to constructed according to the principles of the invention. FIGS. 2A and 2B are perspective views showing a user's finger FG making contact with the display device DD shown in FIG. 1.

A display surface IS in which an image IM is displayed is substantially parallel to a surface defined by a first directional axis DR1 and a second directional axis DR2. A normal line direction of the display surface IS, i.e., a thickness direction of the display device DD, indicates a third directional axis DR3. In each member or unit of the display device DD, a front surface (or an upper surface) is distinguished from a rear surface (or a lower surface) by the third directional axis DR3. However, the first to third directional axes DR1 to DR3 are relative to each other and may be changed to any other directions. Hereinafter, first to third directions correspond to directions respectively indicated by the first to third directional axes DR1 to DR3, and thus the first to third directions are assigned with the same reference numerals as the first to third directional axes DR1 to DR3.

The display device DD according to an embodiment may be applied to a large-sized electronic item, such as a television set, a monitor, etc., and a small and medium-sized electronic item, such as a smartphone, a tablet, a car navigation unit, a game unit, a smart watch, etc. In the following descriptions, a smart phone will be described as the illustrative display device DD.

Referring to FIG. 1, the display surface IS includes a display area DD-DA in which the image IM is displayed and a non-display area DD-NDA disposed adjacent to the display area DD-DA. The image IM is not displayed in the non-display area DD-NDA. FIG. 1 shows application icons as an example of the image IM. As an example, the display area DD-DA may have a quadrangular shape. The non-display area DD-NDA may be disposed to surround the display area DD-DA. However, the shape of the display area DD-DA and the shape of the non-display area DD-NDA may be designed relative to each other without being limited thereto or thereby.

Referring to FIG. 2A, the display device DD may recognize a fingerprint FP of the user's finger FG. In the embodiment, an area in which the fingerprint FP is recognized may be substantially the same as the display area DD-DA. That is, when the fingerprint FP of the user's finger FG makes contact with the display area DD-DA, the display device DD may recognize the fingerprint FP of the user's finger FG.

The display device DD may recognize the fingerprint FP of the user and determine whether the user is an authorized user. In addition, the fingerprint FP of the user may be used for security in mobile device, a financial transaction, or a system control.

According to an embodiment, the fingerprint FP may be recognized through only a portion of the display area DD-DA. According to another embodiment, the fingerprint FP may be recognized not through the display area DD-NA but only through the non-display area DD-NDA.

Referring to FIG. 2B, an area with which the user's finger FG makes contact may be referred to as a "fingerprint contact area" FCA. When the position with which the user's finger FG makes contact is changed, the position of the fingerprint contact area FCA may be changed to correspond to the changed position with which the user's finger FG makes contact.

Figure 3:
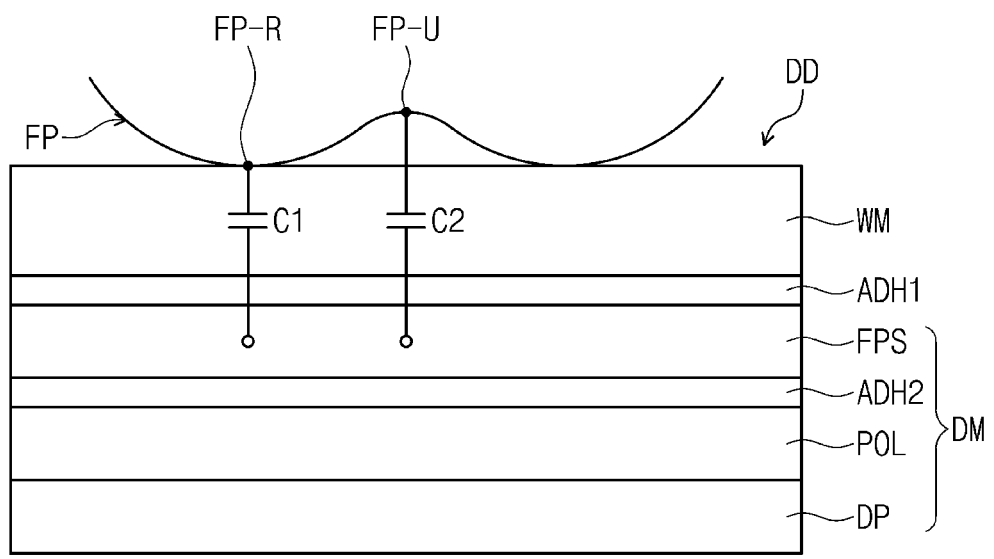
FIG. 3 is a cross-sectional view of a portion of the display device shown in FIG. 1.

FIG. 3 is a cross-sectional view of a portion of the display device DD shown in FIG. 1.

The display device DD may include a window WM and a display module DM. The window WM and the display module DM may be attached to each other by a first adhesive member ADH1.

The display module DM may include an input sensing circuit FPS, a display panel DP, and an anti-reflection member POL. The input sensing circuit FPS and the display panel DP may be attached to each other by a second adhesive member ADH2.

Each of the first adhesive member ADH1 and the second adhesive member ADH2 may be an optically clear adhesive (OCA) film, an optically clear resin (OCR), or a pressure sensitive adhesive (PSA) film. In an embodiment, each of the first adhesive member ADH1 and the second adhesive member ADH2 may include a light curable adhesive material or a heat curable adhesive material, but the material should not be particularly limited.

The window WM may protect the display module DM from an external impact and provide a touch sensing surface or a fingerprint recognition surface. The display surface IS shown in FIGS. 1 to 2B may be the touch sensing surface used to sense a touch event caused by the user. In addition, the display surface IS may be the fingerprint recognition surface used to recognize the fingerprint of the user.

The window WM may include glass, but it should not be limited thereto or thereby. That is, the window WM may include a transparent material having a light transmittance.

The display panel DP may include a plurality of light emitting devices. The display panel DP generates the image IM (refer to FIG. 1) corresponding to image data input thereto. A process of manufacturing the display panel DP may include a low temperature polycrystalline silicon (LTPS) process or a low temperature polycrystalline oxide (LTPO) process.

The input sensing circuit FPS may be disposed on the display panel DP. The input sensing circuit FPS may obtain coordinate information of an external input. In an embodiment, the input sensing circuit FPS may be attached to the display panel DP after being manufactured by a separate process. However, the input sensing circuit FPS may be directly disposed on a surface of the display panel DP. That is, the input sensing circuit FPS may be manufactured together with the display panel DP through a continuous process. In this case, the input sensing circuit FPS may be coupled to the display panel DP without using the second adhesive member ADH2. In FIG. 3 the input sensing circuit is shown disposed above the anti-reflection member POL, but other positions are possible.

The input sensing circuit FPS may include a plurality of sensors SN (refer to FIG. 7) to sense whether an external object makes contact with the window WM. FIG. 3 shows the fingerprint FP of a finger as a representative example of the external object.

The fingerprint FP includes a ridge FP-R and a valley FP-V. The ridge FP-R forms a first capacitance C1 with the input sensing circuit FPS, and the valley FP-V forms a second capacitance C2 with the input sensing circuit FPS. In this case, the first capacitance C1 is different from the second capacitance C2. The input sensing circuit FPS recognizes the fingerprint FP based on a difference between the first capacitance C1 and the second capacitance C2.

The anti-reflection member POL may be disposed between the display panel DP and the input sensing circuit FPS. The anti-reflection member POL absorbs, destructively interferes, or polarizes a light incident thereto from the outside to reduce a reflectance of the external light.

In an embodiment, the anti-reflection member POL may include a color filter, a stack structure of conductive layer/dielectric substance layer/conductive layer, a polarizer, or an optical member.

Figure 4:
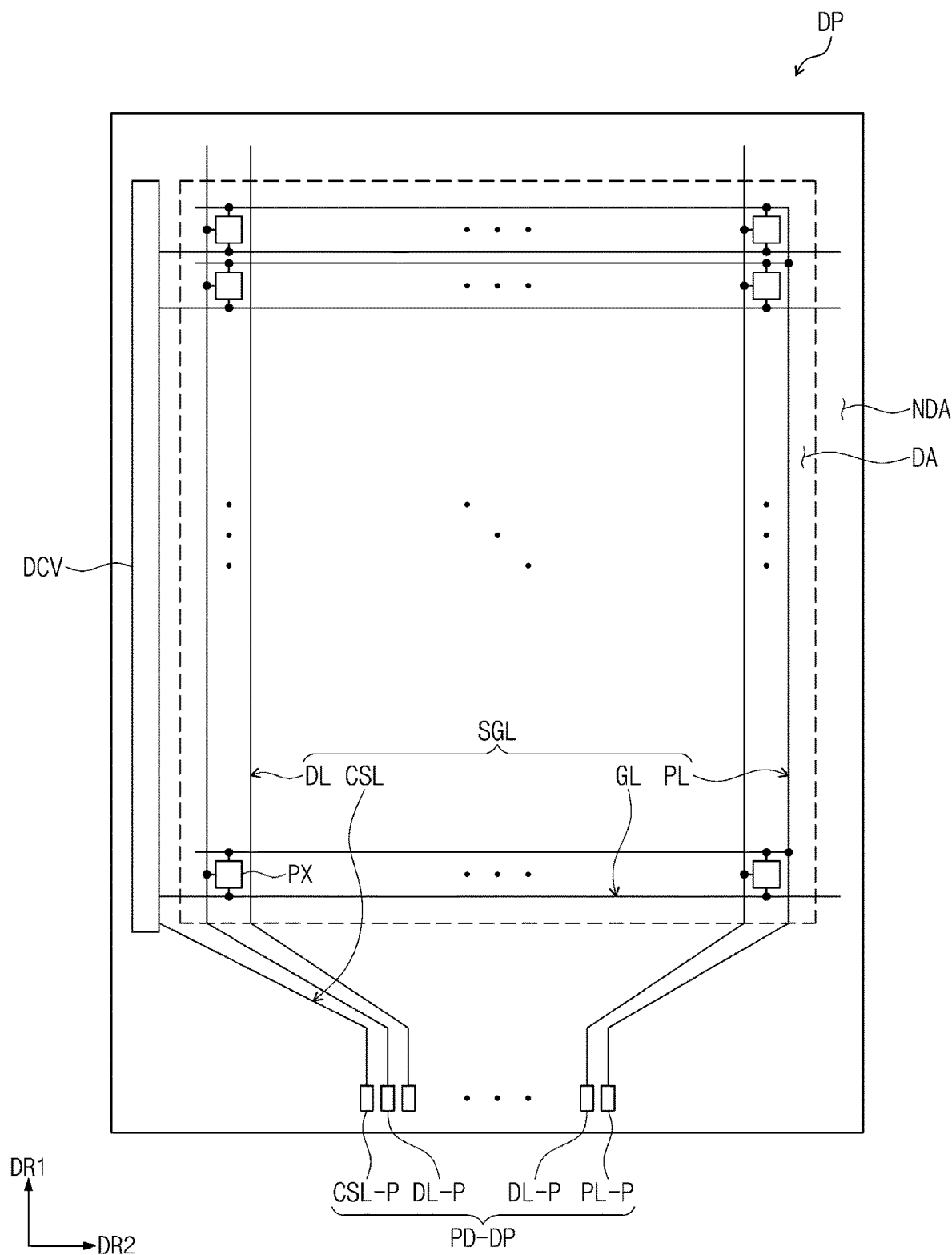
FIG. 4 is a plan view of an embodiment of a display panel constructed according to the principles of the invention.
Figure 5:
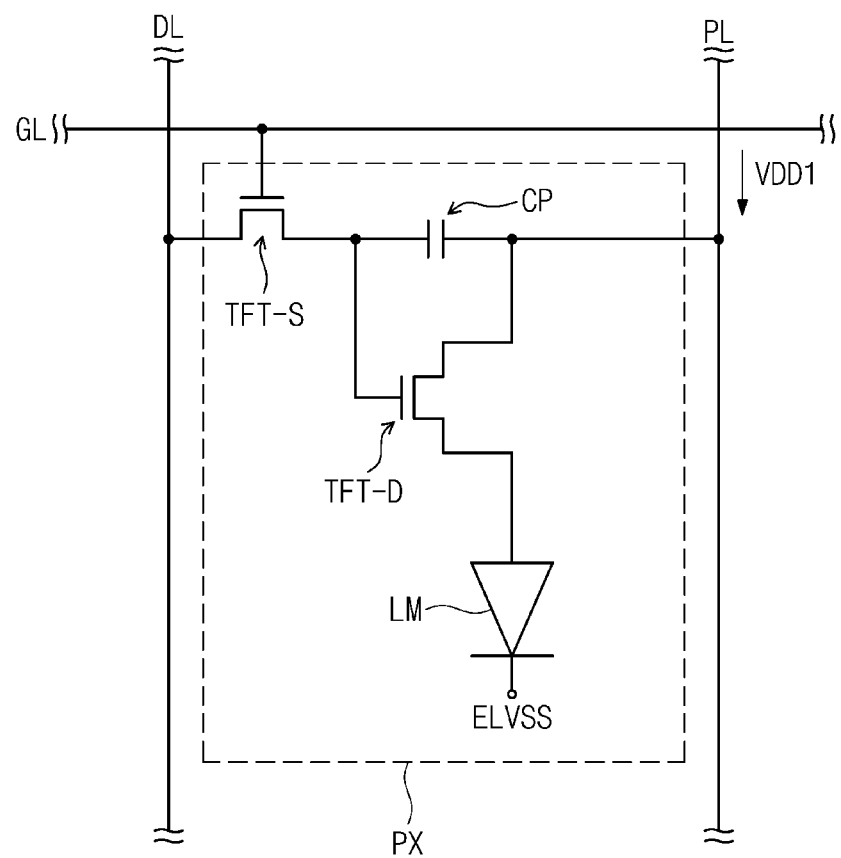
FIG. 5 is an equivalent circuit diagram of an embodiment of a pixel constructed according to the principles of the invention.

FIG. 4 is a plan view of an embodiment of a display panel DP according to the principles of the invention. FIG. 5 is an equivalent circuit diagram of an embodiment of a pixel PX constructed according to the principles of the invention.

Referring to FIG. 4, the display panel DP includes a display area DA and a non-display area NDA when viewed in a plan view. The display area DA and the non-display area NDA of the display panel DP respectively correspond to the display area DD-DA (refer to FIG. 1) and the non-display area DD-NDA (refer to FIG. 1) of the display device DD (refer to FIG. 1). The display area DA and the non-display area NDA of the display panel DP do not need to be completely identical to the display area DD-DA and the non-display area DD-NDA of the display device DD, and the display area DA and the non-display area NDA of the display panel DP may be changed depending on a structure/design of the display panel DP.

The display panel DP includes a plurality of signal lines SGL and a plurality of pixels PX. An area in which the pixels PX are arranged corresponds to the display area DA. In the illustrated embodiment, the non-display area NDA is defined along an edge of the display area DA.

The signal lines SGL include gate lines GL, data lines DL, a power line PL, and a control signal line CSL. Each of the gate lines GL is connected to a corresponding pixel PX of the pixels PX, and each of the data lines DL is connected to a corresponding pixel PX of the pixels PX. The power line PL is connected to the pixels PX. A gate driving circuit DCV is disposed at one side portion of the non-display area NDA and connected to the gate lines GL. The control signal line CSL provides control signals to the gate driving circuit DCV.

Some of the gate lines GL, the data lines DL, the power line PL, and the control signal line CSL are disposed on the same layer, and the others of the gate lines GL, the data lines DL, the power line PL, and the control signal line CSL are disposed on different layers. Among the gate lines GL, the data lines DL, the power line PL, and the control signal line CSL, some signal lines disposed on one layer are referred to as a "first signal line", other signal lines disposed on another layer are referred to as a "second signal line", and the other signal lines disposed on the other layer are referred to as a "third signal line". Each of the gate lines GL, the data lines DL, the power line PL, and the control signal line CSL may include a signal line part and display panel pads PD-DP connected to an end of the signal line part. The signal line part may be defined by a portion except for the display panel pads PD-DP of each of the gate lines GL, the data lines DL, the power line PL, and the control signal line CSL.

The display panel pads PD-DP may be formed through the same process as transistors used to drive the pixels PX. For instance, the display panel pads PD-DP may be formed through the same low temperature polycrystalline silicon (LTPS) process or the low temperature polycrystalline oxide (LTPO) process as the transistors used to drive the pixels PX.

In the illustrated embodiment, the display panel pads PD-DP may include a control pad CSL-P, a data pad DL-P, and a power pad PL-P. A gate pad part is not shown, but the gate pad part overlaps with and is connected to the gate driving circuit DCV. Although not shown separately, a portion of the non-display area NDA, in which the control pad CSL-P, the data pad DL-P, and the power pad PL-P are aligned, is defined as a "pad area".

FIG. 5 shows one pixel PX connected to one gate line GL, one data line DL, and the power line PL. The configuration of the pixel PX should not be limited thereto or thereby.

The pixel PX includes a light emitting element LM as a display element. The light emitting element LM may be a front surface light emitting type diode, a rear surface light emitting type diode, or a both surface light emitting type diode. The light emitting element LM may be, but not limited to, an organic light emitting diode. The pixel PX includes a switching transistor TFT-S, a driving transistor TFT-D, and a capacitor CP as a circuit part that drives the light emitting element LM. The light emitting element LM generates the light in response to electrical signals provided from the transistors TFT-S and TFT-D.

The switching transistor TFT-S outputs a data signal applied thereto through the data line DL in response to a scan signal applied thereto through the gate line GL. The capacitor CP is charged with a voltage corresponding to the data signal provided through the switching transistor TFT-S.

The driving transistor TFT-D is connected to the light emitting element LM. The driving transistor TFT-D controls a driving current flowing through the light emitting element LM based on an amount of electric charge charged in the capacitor CP. The light emitting element LM may generate the light during a turn-on period of the driving transistor TFT-D.

The power line PL provides a first power source voltage VDD1 to the light emitting element LM.

Figure 6:
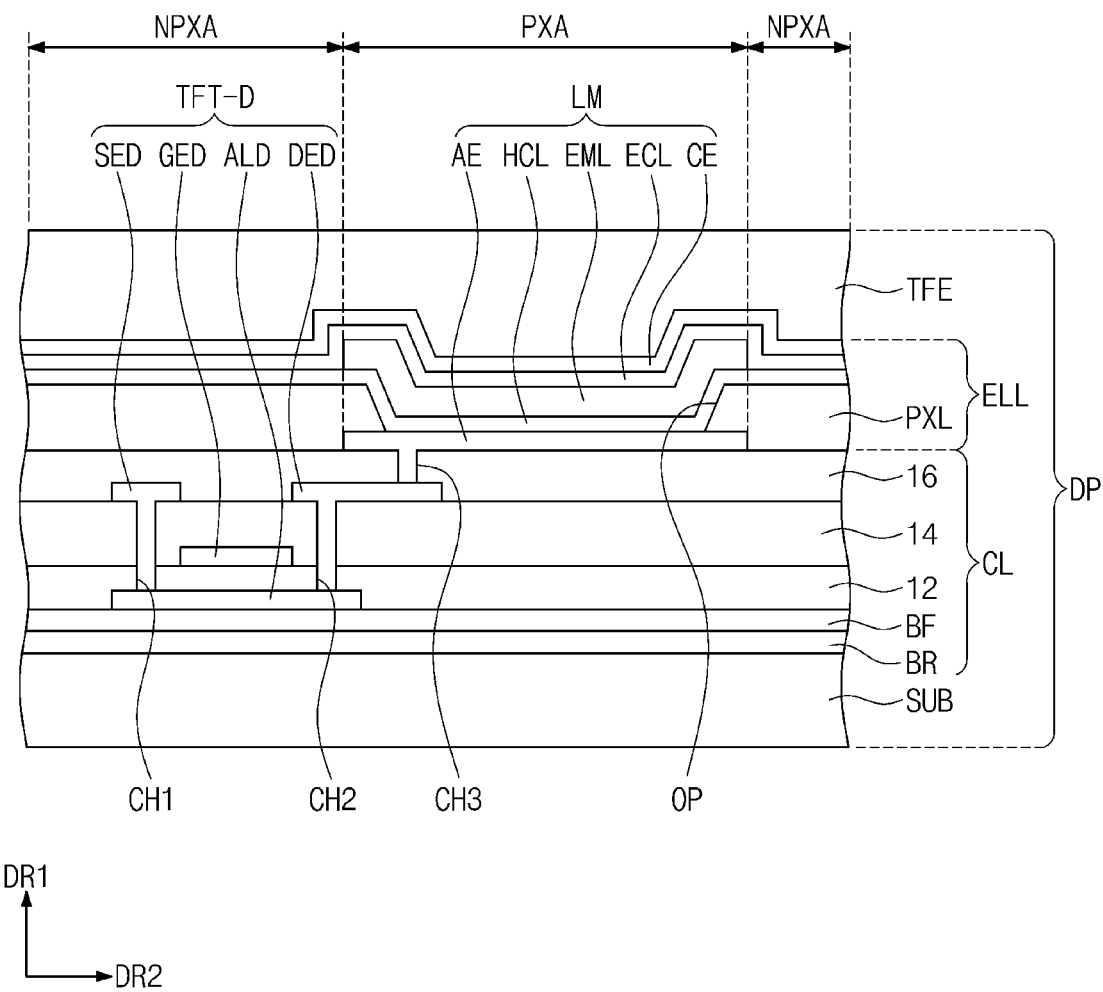
FIG. 6 is a cross-sectional view of the pixel of FIG. 5.

FIG. 6 is a cross-sectional view of the pixel PX of FIG. 5. FIG. 6 shows the cross-section corresponding to portions of the driving transistor TFT-D and the light emitting element LM of the equivalent circuit diagram shown in FIG. 5.

As shown in FIG. 6, a circuit layer CL is disposed on a base layer SUB. A semiconductor pattern ALD of the driving transistor TFT-D is disposed on the base layer SUB. The semiconductor pattern ALD may include at least one of amorphous silicon, polysilicon, and metal oxide semiconductor.

The circuit layer CL may include organic/inorganic layers BR, BF, 12, 14, and 16, the switching transistors TFT-S (refer to FIG. 5), and the driving transistors TFT-D. The organic/inorganic layers BR, BF, 12, 14, and 16 may include functional layers BR and BF, a first insulating layer 12, a second insulating layer 14, and a third insulating layer 16.

The functional layers BR and BF may be disposed on a surface of the base layer SUB. The functional layers BR and BF may include at least one of a barrier layer BR or a buffer layer BF. The semiconductor pattern ALD may be disposed on the barrier layer BR or the buffer layer BF.

The first insulating layer 12 is disposed on the base layer SUB to cover the semiconductor pattern ALD. The first insulating layer 12 includes an organic layer and/or an inorganic layer. Particularly, the first insulating layer 12 may include a plurality of inorganic thin layers. The inorganic thin layers may include a silicon nitride layer and a silicon oxide layer.

A control electrode GED of the driving transistor TFT-D is disposed on the first insulating layer 12. Although not shown in FIG. 6, a control electrode of the switching transistor TFT-S (refer to FIG. 5) may be disposed on the first insulating layer 12. The control electrode GED may be formed through the same photolithography process as the gate line GL (refer to FIG. 4). In other words, the control electrode GED and the gate lines GL may include the same material, may have the same stack structure, and may be disposed on the same layer.

The second insulating layer 14 is disposed on the first insulating layer 12 to cover the control electrode GED. The second insulating layer 14 includes an organic layer and/or an inorganic layer. Particularly, the second insulating layer 14 may include a plurality of inorganic thin layers. The inorganic thin layers may include a silicon nitride layer and a silicon oxide layer.

The data line DL (refer to FIG. 4) may be disposed on the second insulating layer 14. An input electrode SED and an output electrode DED of the driving transistor TFT-D are disposed on the second insulating layer 14. Although not shown in figures, an input electrode and an output electrode of the switching transistor TFT-S are disposed on the second insulating layer 14. The input electrode SED may be branched from a corresponding data line among the data lines DL. The power line PL (refer to FIG. 4) may be disposed on the same layer as the data lines DL. The input electrode SED may be branched from the power line PL.

A portion of an electrode of the capacitor CP is disposed on the second insulating layer 14. The portion of the electrode of the capacitor CP may be formed through the same photolithography process as the data lines DL and the power line PL and may include the same material as the data lines DL and the power line PL. The portion of the electrode of the capacitor CP may have the same stack structure as the data lines DL and the power line PL and may be disposed on the same layer as the data lines DL and the power line PL.

The input electrode SED and the output electrode DED are connected to the semiconductor pattern ALD respectively through a first contact hole CH1 and a second contact hole CH2, which are defined through the first insulating layer 12 and the second insulating layer 14. Meanwhile, the structure of the switching transistor TFT-S and the driving transistor TFT-D may be changed to a bottom gate structure according to another embodiment.

The third insulating layer 16 is disposed on the second insulating layer 14 to cover the input electrode SED and the output electrode DED. The third insulating layer 16 includes an organic layer and/or an inorganic layer. In particular, the third insulating layer 16 may include an organic material to provide a flat surface.

One of the first insulating layer 12, the second insulating layer 14, and the third insulating layer 16 may be omitted depending on a circuit structure of the pixel. Each of the second insulating layer 14 and the third insulating layer 16 may be an interlayer insulating layer. The interlayer insulating layer is disposed between a conductive pattern disposed under the interlayer insulating layer and a conductive pattern disposed on the interlayer insulating layer to insulate the conductive pattern disposed under the interlayer insulating layer and the conductive pattern disposed on the interlayer insulating layer.

A light emitting element layer ELL is disposed on the third insulating layer 16. The light emitting element layer ELL includes a pixel definition layer PXL and the light emitting 71element LM. An anode AE is disposed on the third insulating layer 16. The anode AE is connected to the output electrode DED of the driving transistor TFT-D through a third contact hole CH3 defined through the third insulating layer 16. The pixel definition layer PXL includes an opening OP defined therethrough to expose a portion of the anode AE through the opening OP.

The light emitting element layer EL includes a light emitting area PXA and a non-light emitting area NPXA disposed adjacent to the light emitting area PXA. The non-light emitting area NPXA surrounds the light emitting area PXA. In the illustrated embodiment, the light emitting area PXA is defined corresponding to the anode AE, but it should not be limited thereto or thereby as long as the light emitting area PXA emits the light. The light emitting area PXA may be defined corresponding to a portion of the anode AE exposed through the opening OP.

A hole control layer HCL may be commonly disposed over the light emitting area PXA and the no-light emitting area NPXA. Although not shown separately, a layer commonly disposed over plural areas like the hole control layer HCL may be commonly formed over the pixels PX (refer to FIG. 4).

A light emitting layer EML is disposed on the hole control layer HCL. The light emitting layer EML may be disposed only in an area corresponding to the opening OP. That is, the light emitting layer EML may be provided in plural portions respectively formed in the pixels PX.

The light emitting layer EML may include an organic material or an inorganic material.

An electron control layer ECL is disposed on the light emitting layer EML. A cathode CE is disposed on the electron control layer ECL. The cathode CE may be commonly disposed over the pixels PX.

In the illustrated embodiment, the light emitting layer EML is patterned, but the light emitting layer EML may be commonly disposed over the pixels PX. In this case, the light emitting layer EML may generate a white light. In addition, the light emitting layer EML may have a multi-layer structure.

In the illustrated embodiment, a thin film encapsulation layer TFE directly covers the cathode CE. In an illustrated embodiment, a capping layer may further be disposed to cover the cathode CE. In this case, the thin film encapsulation layer TFE directly covers the capping layer. The thin film encapsulation layer TFE may include an organic layer including an organic material and an inorganic layer including an inorganic material.

Figure 7:
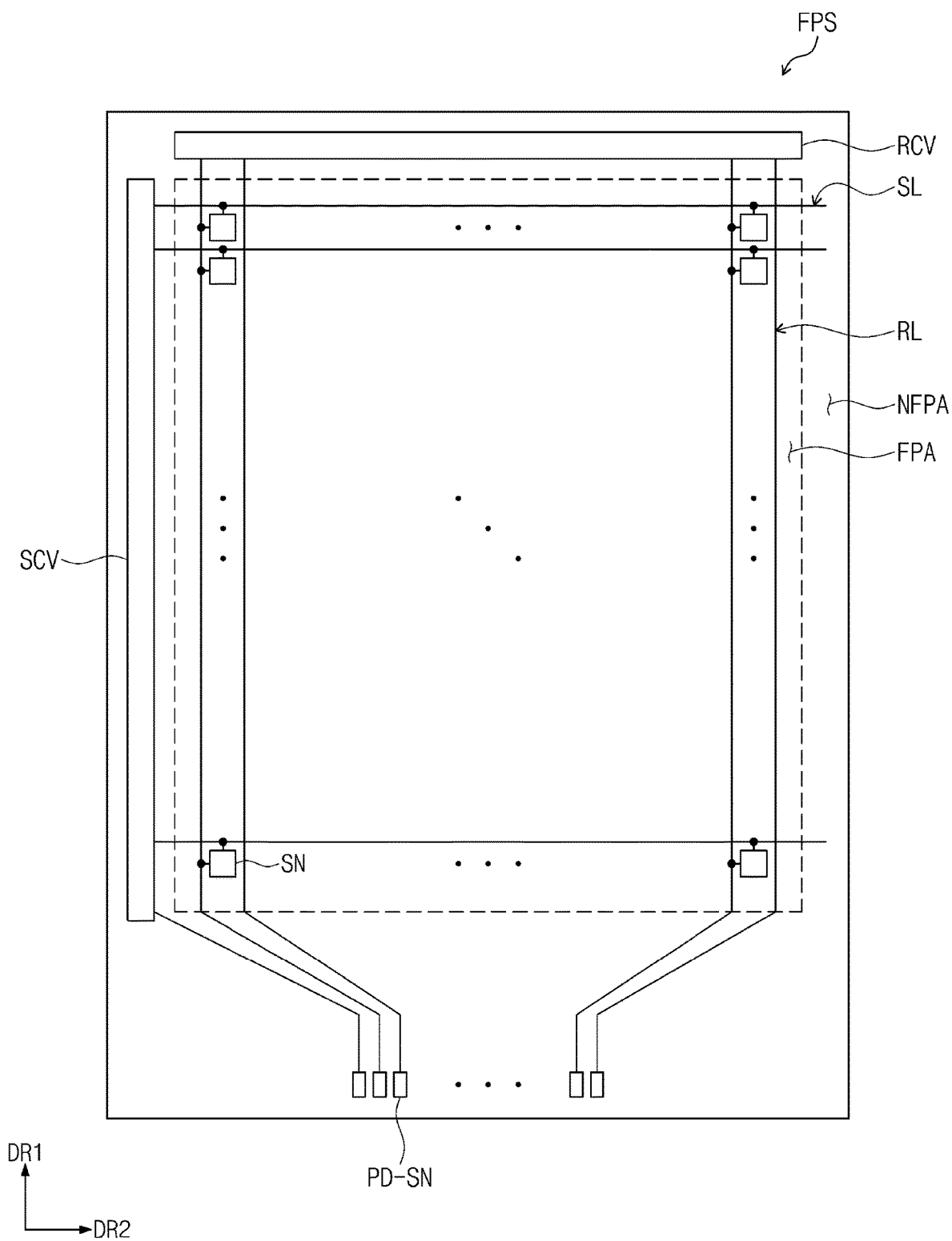
FIG. 7 is a plan view of an embodiment of an input sensing circuit constructed according to the principles of the invention.
Figure 8:
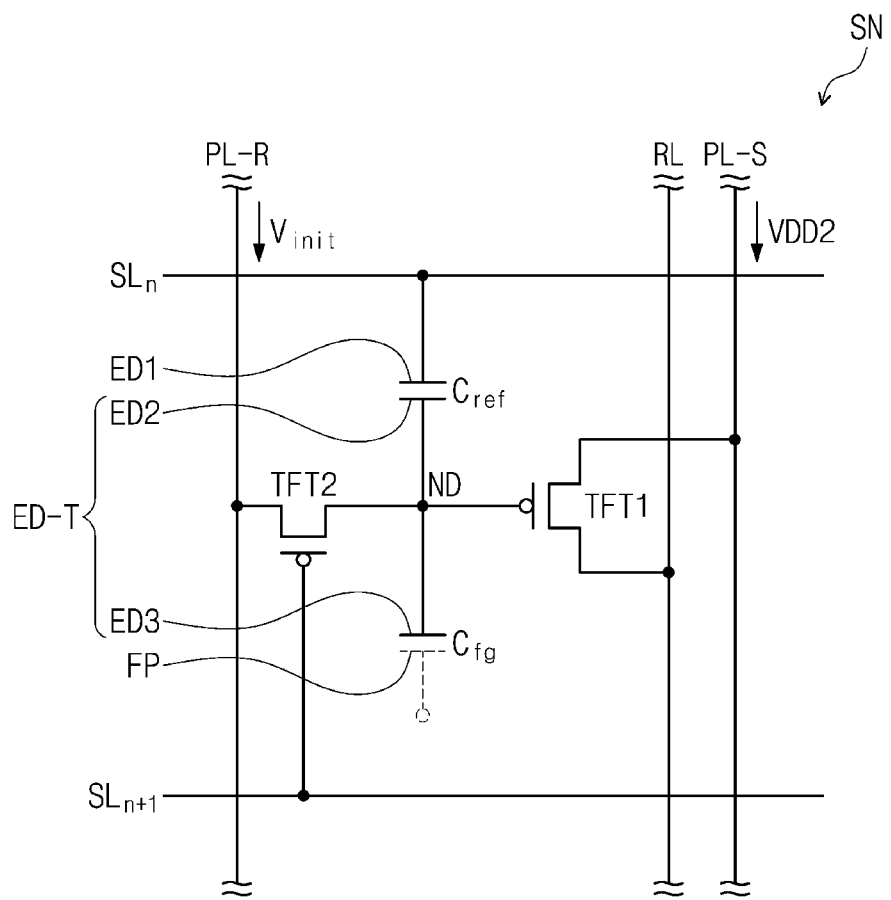
FIG. 8 is an equivalent circuit diagram of a sensor in the input sensing circuit shown in FIG. 7.
Figure 9:
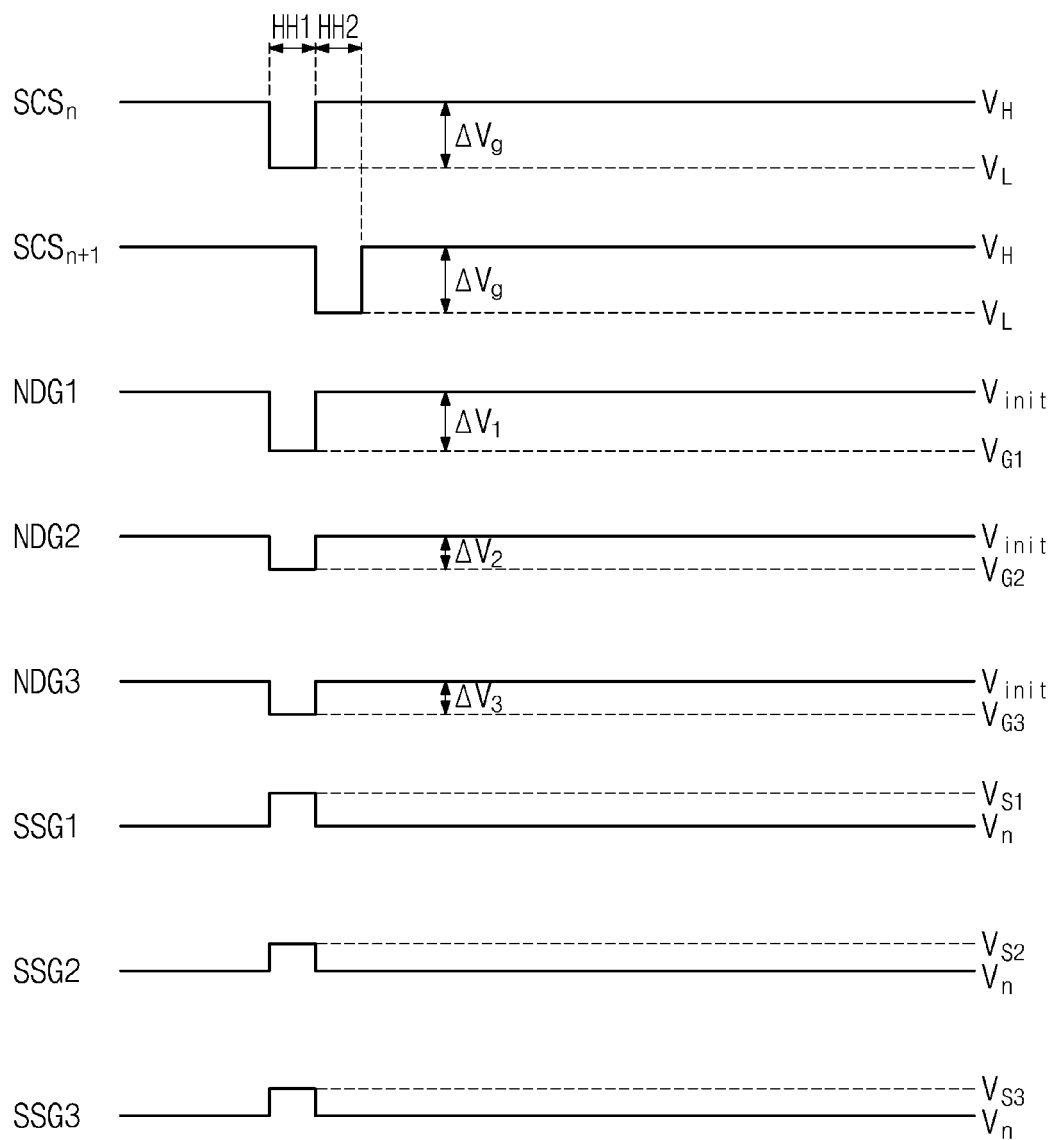
FIG. 9 is e representative timing diagram showing signals applied to and output from the sensor shown in FIG. 8.

FIG. 7 is a plan view of an embodiment of an input sensing circuit FPS constructed according to the principles of the invention. FIG. 8 is an equivalent circuit diagram of a sensor SN in the input sensing circuit shown in FIG. 7. FIG. 9 is a representative timing diagram showing signals applied to and output from the sensor SN shown in FIG. 8.

Referring to FIG. 7, the input sensing circuit FPS includes an input recognition area FPA and an input non-recognition area NFPA when viewed in a plan view. The input recognition area FPA and the input non-recognition area NFPA of the input sensing circuit FPS may respectively correspond to the display area DD-DA (refer to FIG. 1) and the non-display area DD-NDA (refer to FIG. 1) of the display device DD (refer to FIG. 1). The input recognition area FPA and the input non-recognition area NFPA of the input sensing circuit FPS do not need to be completely identical to the display area DD-DA and the non-display area DD-NDA of the display device DD and vary in accordance with the structure and design of the input sensing circuit FPS.

The input sensing circuit FPS includes a plurality of scan lines SL, a plurality of readout lines RL, and a plurality of sensors SN. An area in which the sensors SN are arranged may be defined as the input recognition area FPA.

Each of the scan lines SL is connected to a corresponding sensor SN among the sensors SN, and each of the readout lines RL is connected to a corresponding sensor SN among the sensors SN.

The distance between adjacent sensors SN may be equal to or greater than about 3 micrometers (IA) and equal to or smaller than about 120 micrometers (m), and preferably, the distance between the adjacent sensors SN may be equal to or greater than about 20 micrometers (IA) and equal to or smaller than about 100 micrometers (m). If the distance between the sensors SN is greater than about 100 micrometers (m), it is difficult to obtain a resolution required to recognize the fingerprint. If the distance between the sensors SN is smaller than about 20 micrometers (m), the process becomes complex, and a manufacturing cost increases.

A scan driving circuit SCV may be disposed at one side portion of the input non-recognition area NFPA and connected to the scan lines SL. According to another embodiment, the scan driving circuit SCV may be substantially the same as the gate driving circuit DCV (refer to FIG. 4).

A readout circuit RCV may be disposed at another side portion of the input non-recognition area NFPA and connected to the readout lines RL. According to another embodiment, signals provided from an external integrated circuit may be applied to the readout lines RL without using the readout circuit RCV.

Each of the scan lines SL and the readout lines RL may include sensor pads PD-SN connected to ends of the scan lines SL and the readout lines RL.

The sensor pads PD-SN may be formed through the same process as the transistors that drive the sensors SN.

A scan signal is sequentially applied to the scan lines SL, and the readout lines RL receive signals output from the sensors SN and transmit the received signals to the readout circuit RCV. According to another embodiment, the signals output from the sensors SN may be transmitted to another circuit (not shown) that processes the signals.

FIG. 8 shows a sensor SN connected to the scan lines SLn and SLn+1 and the readout line RL as a representative example. The sensor SN should not be limited to a configuration shown in FIG. 8.

The sensor SN may include a first transistor TFT1, a reference capacitor Cref, and a second transistor TFT2.

The first transistor TFT1 includes a first input electrode, a first output electrode, and a first control electrode.

The first input electrode is connected to a sensor-power line PL-S. The first input electrode may receive a second power source voltage VDD2 from the sensor-power line PL-S. In an embodiment, the second power source voltage VDD2 may be substantially the same as the first power source voltage VDD1 (refer to FIG. 5).

The first output electrode is connected to the readout line RL. In an embodiment, the first output electrode is directly connected to the readout line RL to provide the signal applied to the first input electrode to the readout line RL.

The first control electrode may be connected to the second transistor TFT2 and the reference capacitor Cref.

The first transistor TFT1 may be disposed between the readout line RL and the sensor-power line PL-S in the form of a single transistor. The single transistor form means that only one transistor exists between two points.

The reference capacitor Cref includes a first electrode ED1 and a second electrode ED2. The first electrode ED1 is connected to an n-th scan line SLn among the scan lines SL. The first electrode ED1 may be branched from the n-th scan line SLn. The second electrode ED2 is connected to the first control electrode of the first transistor TFT1.

The second transistor TFT2 includes a second input electrode, a second output electrode, and a second control electrode.

The second input electrode is connected to a reference line PL-R. The second input electrode may receive an initialization voltage Vinit from the reference line PL-R.

The second output electrode is connected to the first control electrode of the first transistor TFT1. The second output electrode is connected to the second electrode ED2 of the reference capacitor Cref.

The second control electrode is connected to an (n+1)th scan line SLn+1 among the scan lines SL. The second transistor TFT2 is turned on in response to a signal applied to the second control electrode from the (n+1)th scan line SLn+1 and outputs the initialization voltage Vinit through the second output electrode.

The sensor SN further includes a third electrode ED3. The third electrode ED3 is connected to the first control electrode of the first transistor TFT1. The third electrode ED3 is connected to the second electrode ED2 of the reference capacitor Cref.

The third electrode ED3 may form a capacitance Cfg with an external object. The external object may be the fingerprint FP (refer to FIG. 3) of the finger. The capacitance Cfg may be the first capacitance C1 (refer to FIG. 3) or the second capacitance C2 (refer to FIG. 3).

The point at which the first control electrode of the first transistor TFT1, the second output electrode of the second transistor TFT2, the second electrode ED2, and the third electrode ED3 are electrically connected to each other may be referred to as a "node ND". A degree to which the first transistor TFT1 is turned on varies depending on a level of a voltage at the node ND.

In an embodiment, the second electrode ED2 and the third electrode ED3 may be implemented by one transparent electrode ED-T disposed on the same layer. A portion of the transparent electrode ED-T, which forms the reference capacitor Cref with the first electrode ED1 branched from the n-th scan line SLn, may be defined as the second electrode ED2, and a portion of the transparent electrode ED-T, which forms the capacitance Cfg with the fingerprint FP (refer to FIG. 3), may be defined as the third electrode ED3. This will be described in detail with reference to FIGS. 10C and 11.

Referring to FIG. 9, the scan signals SCSn and SCSn+1 are sequentially applied to the n-th scan line SLn and the (n+1)th scan line SLn+1. Each of the scan signals SCSn and SCSn+1 may have a high voltage $V_H$ and a low voltage $V_L$. In an embodiment, the high voltage $V_H$ is within a range from about 4 volts to about 6 volts, and the low voltage $V_L$ is within a range from about −4 volts to about −6 volts. Each of the scan signals SCSn and SCSn+1 may have a pulse waveform.

A voltage variation ΔVg of the scan signal has a value corresponding to a difference between the high voltage $V_H$ and the low voltage $V_L$.

The n-th scan signal SCSn is applied to the first electrode ED1 of the reference capacitor Cref (refer to FIG. 8) through the n-th scan line SLn. The low voltage $V_L$ is applied to the first electrode ED1 during a first period HH1.

In this case, the voltage of the node ND is changed. A voltage variation ΔV1, ΔV2, and ΔV3 of the node ND may be a first voltage variation ΔV1, a second voltage variation ΔV2, and a third voltage variation ΔV3 according to whether the touch event occurs, whether the ridge of the fingerprint makes contact with the display area DD-DA, or whether the valley of the fingerprint makes contact with the display area DD-DA.

A first node signal NDG1 indicates a variation of voltage value at the node ND when the third electrode ED3 does not form the capacitance with the external object (or fingerprint). The first node signal NDG1 may have the initialization voltage Vinit and a first node voltage $V_{G1}$. The first node signal NDG1 has the initialization voltage Vinit when the n-th scan signal having the high voltage $V_H$ is applied to the first electrode ED1 of the reference capacitor Cref. Also, the first node signal NDG1 has the first node voltage $V_{G1}$ when the n-th scan signal having the low voltage $V_L$ is applied to the first electrode ED1. At this time, when the voltage of the first electrode ED1 decreased by being applied to the low voltage $V_L$, the voltage of the second electrode ED2, that is, the first node voltage $V_{G1}$ also decreased. In an embodiment, the initialization voltage Vinit is within a range from about 4 volts to about 6 volts, and the first node voltage $V_{G1}$ is within a range from about −2 volts to about −4 volts.

The first voltage variation $\Delta V1$ has a value corresponding to a difference between the initialization voltage Vinit and the first node voltage $V_{G1}$.

A second node signal NDG2 indicates a variation of voltage value at the node ND when the third electrode ED3 forms the capacitance with the ridge of the fingerprint. The second node signal NDG2 may have the initialization voltage Vinit and a second node voltage $V_{G2}$. The second node signal NDG2 has the initialization voltage Vinit when the n-th scan signal having the high voltage $V_H$ is applied to the first electrode ED1 of the reference capacitor Cref. Also, the second node signal NDG2 has the second node voltage $V_{G2}$ when the n-th scan signal having the low voltage $V_L$ is applied to the first electrode ED1. At this time, when the voltage of the first electrode ED1 decreased by being applied to the low voltage $V_L$, the voltage of the second electrode ED2, that is, the second node voltage $V_{G2}$ also decreased. However, when the third electrode ED3 forms the first capacitance C1 with the ridge of the fingerprint FP, the second node voltage $V_{G2}$ may increase relative to the first node voltage $V_{G1}$. In the illustrative embodiment, the initialization voltage Vinit is within a range from about 4 volts to about 6 volts, and the second node voltage $V_{G2}$ is within a range from about −1 volts to about 1 volts.

The second voltage variation $\Delta V2$ has a value corresponding to a difference between the initialization voltage Vinit and the second node voltage $V_{G2}$.

A third node signal NDG3 indicates a variation of voltage value at the node ND when the third electrode ED3 forms the capacitance with the valley of the fingerprint. The third node signal NDG3 may have the initialization voltage Vinit and a third node voltage $V_{G3}$. The third node signal NDG3 has the initialization voltage Vinit when the n-th scan signal having the high voltage $V_H$ is applied to the first electrode ED1 of the reference capacitor Cref. Also, the second node signal NDG3 has the third node voltage $V_{G3}$ when the n-th scan signal having the low voltage $V_L$ is applied to the first electrode ED1. At this time, when the voltage of the first electrode ED1 decreased by being applied to the low voltage $V_L$, the voltage of the second electrode ED2, that is, the third node voltage $V_{G3}$ also decreased. However when the third electrode ED3 forms the second capacitance C2 with the valley of the fingerprint FP, the third node voltage $V_{G3}$ may increase relative to the first node voltage $V_{G1}$. In an embodiment, the initialization voltage Vinit is within a range from about 4 volts to about 6 volts, and the third node voltage $V_{G3}$ is within a range from about −1 volts to about 1 volts.

The third voltage variation $\Delta V3$ has a value corresponding to a difference between the initialization voltage Vinit and the third node voltage $V_{G3}$.

The first voltage variation $\Delta V1$ is greater than the second voltage variation $\Delta V2$ or the third voltage variation $\Delta V3$. The second voltage variation $\Delta V2$ is different from the third voltage variation $\Delta V3$. For example, the second voltage variation $\Delta V2$ may be greater than the third voltage variation $\Delta V3$. As described above, since the first, second, and third voltage variations $\Delta V1$, $\Delta V2$, and $\Delta V3$ of the node ND are different from each other, the voltage of the node ND varies, and thus the degrees to which the first transistor TFT1 is turned on varies. Due to the difference in degree of the turned-on of the first transistor TFT1, sensing signals SSG1, SSG2, and SSG3 output to the readout line RL are changed.

When the first node signal NDG1 is applied to the node ND, a first sensing signal SSG1 is output to the readout line RL. The first sensing signal SSG1 has a reference voltage Vn and a first sensing voltage $V_{S1}$. In detail, the first sensing signal SSG1 has the first sensing voltage $V_{S1}$ during the first period HH1. In an embodiment, the reference voltage Vn is about 0 volts, and the first sensing voltage $V_{S1}$ is within a range from about 3 volts to about 5 volts.

When the second node signal NDG2 is applied to the node ND, a second sensing signal SSG2 is output to the readout line RL. The second sensing signal SSG2 has the reference voltage Vn and a second sensing voltage $V_{S2}$. In detail, the second sensing signal SSG2 has the second sensing voltage $V_{S2}$ during the first period HH1. In an embodiment, the reference voltage Vn is about 0 volts, and the second sensing voltage $V_{S2}$ is within a range from about 2 volts to about 3 volts.

When the third node signal NDG3 is applied to the node ND, a third sensing signal SSG3 is output to the readout line RL. The third sensing signal SSG3 has the reference voltage Vn and a third sensing voltage $V_{S3}$. In detail, the third sensing signal SSG3 has the third sensing voltage $V_{S3}$ during the first period HH1. In an embodiment, the reference voltage Vn is about 0 volts, and the third sensing voltage $V_{S3}$ is within a range from about 2 volts to about 3 volts.

The first sensing voltage $V_{S1}$ is greater than the second and third sensing voltages $V_{S2}$ and $V_{S3}$. That is, the first sensing voltage $V_{S1}$ output to the readout line RL when the fingerprint does not make contact with the display area DD-DA is greater than the second and third sensing voltages $V_{S2}$ and $V_{S3}$ when the fingerprint makes contact with the display area DD-DA.

The second sensing voltage $V_{S2}$ is different from the third sensing voltages $V_{S3}$. For example, the second sensing voltage $V_{S2}$ may be greater than the third sensing voltages $V_{S3}$. That is, when the fingerprint makes contact with the display area DD-DA, the second sensing voltage $V_{S2}$ applied to the readout line RL by the second capacitance C2 formed between the valley FP-U of the fingerprint and the input sensing circuit FPS may be greater than the third sensing voltage $V_{S3}$ applied to the readout line RL by the first capacitance C1 formed between the ridge FP-R of the fingerprint and the input sensing circuit FPS.

As described above, the fingerprint of the finger may be recognized by measuring the voltages of the first, second, and third sensing signals SSG1, SSG2, and SSG3 output to the readout line RL during the first period HH1.

The second transistor TFT2 is turned on in response to the (n+1)th scan signal SCSn+1 applied to the second control electrode of the second transistor TFT2 during a second period HH2 occurring after the first period HH1. When the second transistor TFT2 is turned on, the initialization voltage Vinit applied to the second input electrode is applied to the node ND through the second output electrode. That is, voltage of the node ND is initialized as the initialization voltage Vinit.

Figure 10A:
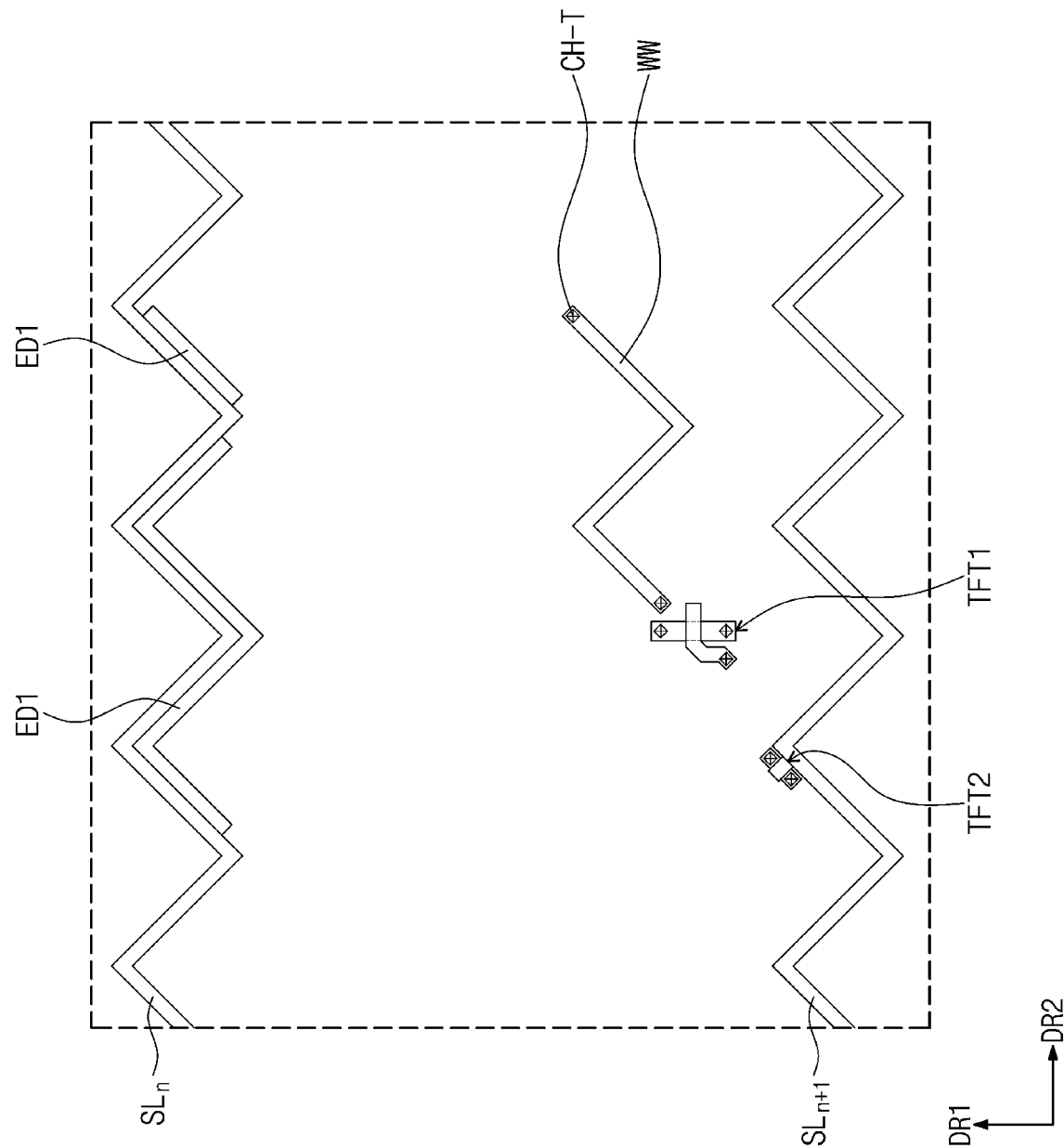
FIGS. 10A, 10B, and 10C are plan views showing layouts of an embodiment of a sensor of an input sensing circuit constructed according to the principles of the invention.
Figure 10B:
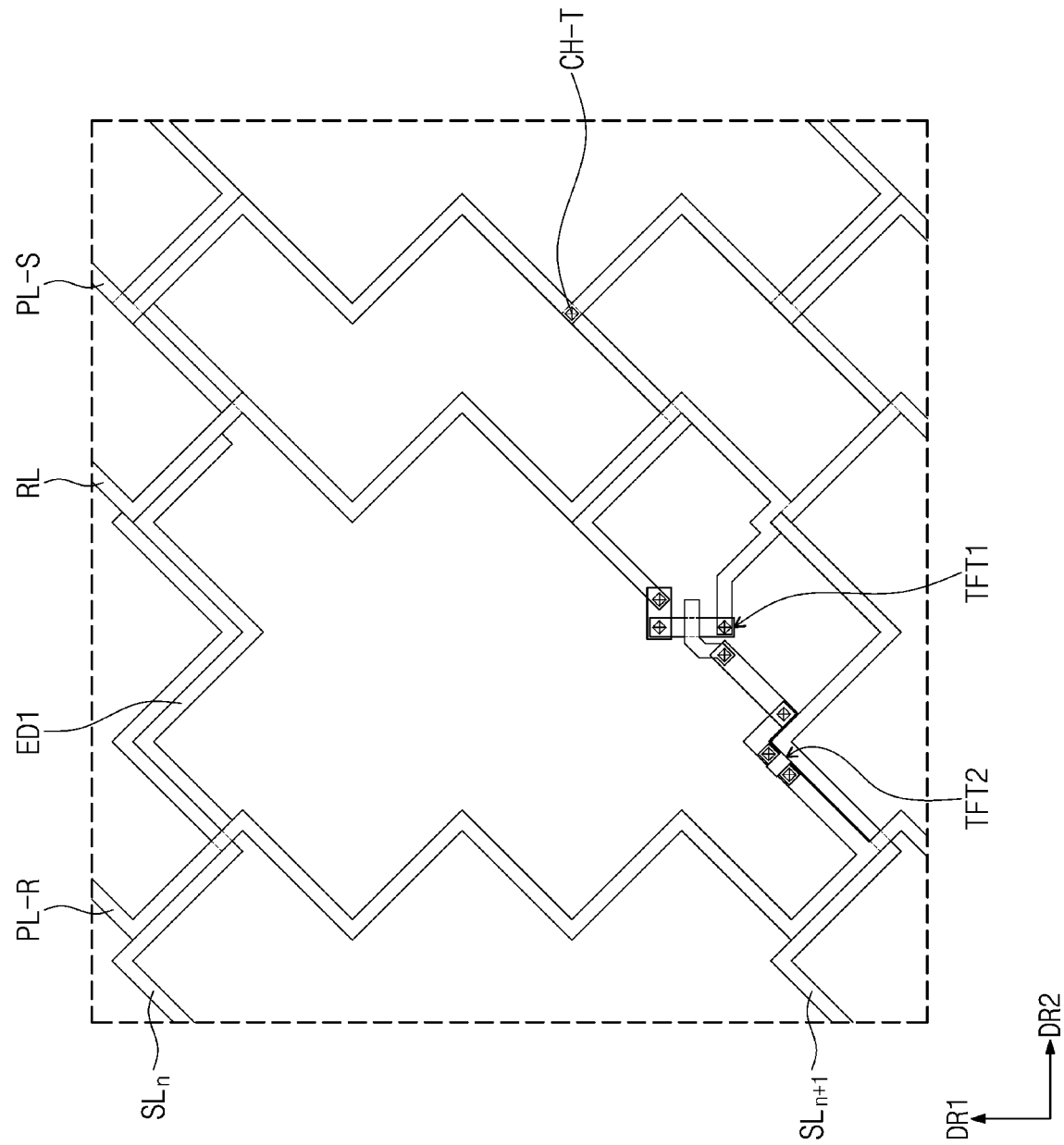
Figure 10C:
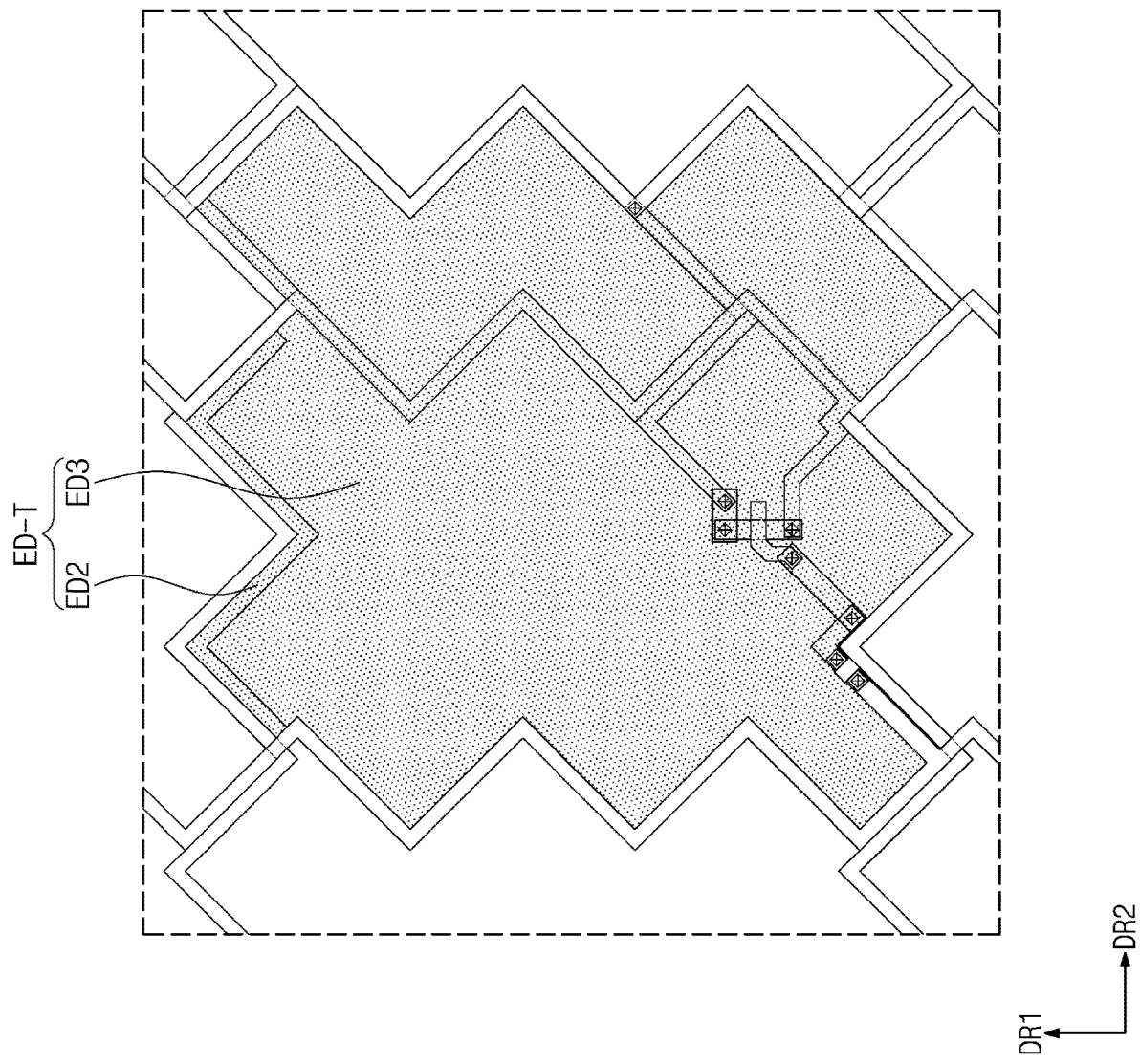
Figure 11:
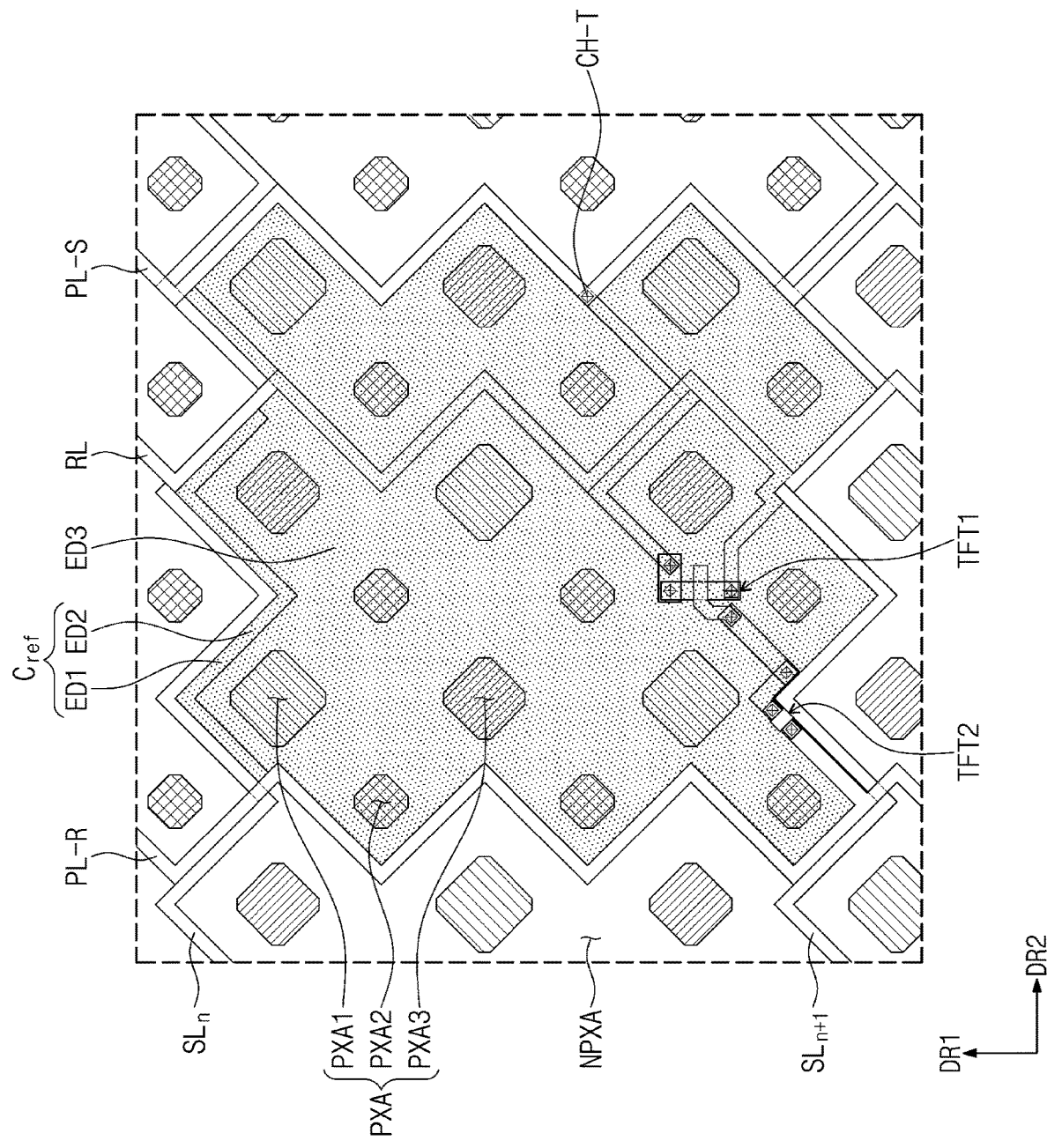
FIG. 11 is a plan view showing a light emitting area of a display panel in the layout of the sensor of the input sensing circuit shown in FIG. 10C.

FIGS. 10A, 10B, and 10C are plan views showing layouts of an embodiment of a sensor SN of an input sensing circuit FPS constructed according to the principles of the invention, and FIG. 11 is a plan view showing light emitting areas PXA of a display panel DP in the layout of the sensor SN of the input sensing circuit FPS shown in FIG. 10C.

FIGS. 10A, 10B, 10C, and 11 show the n-th scan line SLn and the (n+1)th scan line SLn+1 among the scan lines SL as a representative example.

Referring to FIGS. 10A and 10B, each of the n-th scan line SLn and the (n+1)th scan line SLn+1 may extend in a zigzag shape along the second direction DR2. The first electrode ED1 is connected to the n-th scan line SLn. In the illustrated embodiment, the first electrode ED1 may be branched from the n-th scan line SLn. The n-th scan line SLn and the (n+1)th scan line SLn+1 may be disposed on a first layer.

The readout line RL, the sensor-power line PL-S, and the reference line PL-R may be disposed on a second layer as an upper layer of the first layer corresponding to the scan lines SLn and SLn+1. Each of the readout line RL, the sensor-power line PL-S, and the reference line PL-R may extend in a zigzag shape along the first direction DR1. Due to the zigzag shape, the light emitting areas PXA may be prevented from being covered by the lines SLn, SLn+1, RL, PL-S, and PL-R, and a moiré phenomenon may be prevented from occurring.

The first control electrode of the first transistor TFT1 and the second control electrode of the second transistor TFT2 may be disposed on the same layer (i.e., first layer) as the scan lines SLn and SLn+1. The first input electrode and the first output electrode of the first transistor TFT1 may be disposed on a third layer as a lower layer of the first layer corresponding to the scan lines SLn and SLn+1. In addition, referring to FIG. 10A, for example, the first input electrode of the first transistor TFT1 may include a connection electrode WW disposed on the first layer. The second input electrode and the second output electrode of the second transistor TFT2 may be disposed on the third layer as a lower layer of the first layer corresponding to the scan lines SLn and SLn+1.

As described above, the layers different from each other (i.e., first layer, second layer, third layer) may be distinguished from each other by insulating layers (not shown) disposed therebetween. The lines SLn and SLn+1 disposed on the first layer, the lines RL, PL-S, and PL-R disposed on the second layer, the control electrode of the transistors TFT1 and TFT2 disposed on the first layer, and the input and output electrodes of the transistors TFT1 and TFT2 disposed on the third layer, which are disposed on the different layers, may be connected to each other through a plurality of contact holes CH-T defined through the insulating layer.

Referring to FIG. 10C, the transparent electrode ED-T may be disposed on an upper layer (i.e., fourth layer) relative to the readout line RL, the sensor-power line PL-S, and the reference line PL-R.

The transparent electrode ED-T may include the second electrode ED2 and the third electrode ED3. The transparent electrode ED-T may include a transparent conductive oxide, such as indium tin oxide (ITO), indium zinc oxide (IZO), zinc oxide (ZnO), indium tin zinc oxide (ITZO), etc. Further, the transparent electrode ED-T may include a conductive polymer like PEDOT, a metal nanowire, a graphene, and the like.

The second electrode ED2 overlaps with the first electrode ED1. Accordingly, the first electrode ED1 and the second electrode ED2 form the reference capacitor Cref.

Referring to FIGS. 3 and 8, the third electrode ED3 may form the capacitance Cfg with the ridge FP-R or the valley FP-V of the fingerprint FP. The capacitance Cfg formed by the third electrode ED3 and the ridge FP-R may be the first capacitance C1, and the capacitance Cfg formed by the third electrode ED3 and the valley FP-V may be the second capacitance C2.

FIG. 11 shows the light emitting areas PXA and the non-light emitting area NPXA of the display panel DP disposed under the input sensing circuit FPS in FIG. 10C.

The light emitting areas PXA may include a first light emitting area PXA1, a second light emitting area PXA2, and a third light emitting area PXA3.

In an embodiment, the first light emitting area PXA1 emits a first light having a first wavelength, the second light emitting area PXA2 emits a second light having a second wavelength, and the third light emitting area PXA3 emits a third light having a third wavelength. The first wavelength is shorter than the second wavelength, and the second wavelength is shorter than the third wavelength. For instance, the first light is a blue light, the second light is a green light, and the third light is a red light.

Referring to FIG. 11, the reference capacitor Cref may be disposed adjacent to the first light emitting area PXA1 emitting the first light (i.e., the blue light) among the first, second, and third light emitting areas PXA1, PXA2, and PXA3. When the first electrode ED1 is formed to form the reference capacitor Cref, a portion of the light emitting areas PXA may be covered. Since the first light (the blue light) emitted from the first light emitting area PXA1 has a visibility lower than that of the second light (the green light) and the third light (the red light), the display device DD may have superior display quality by disposing the reference capacitor Cref to be adjacent to the first light emitting area PXA1.

Figure 12:
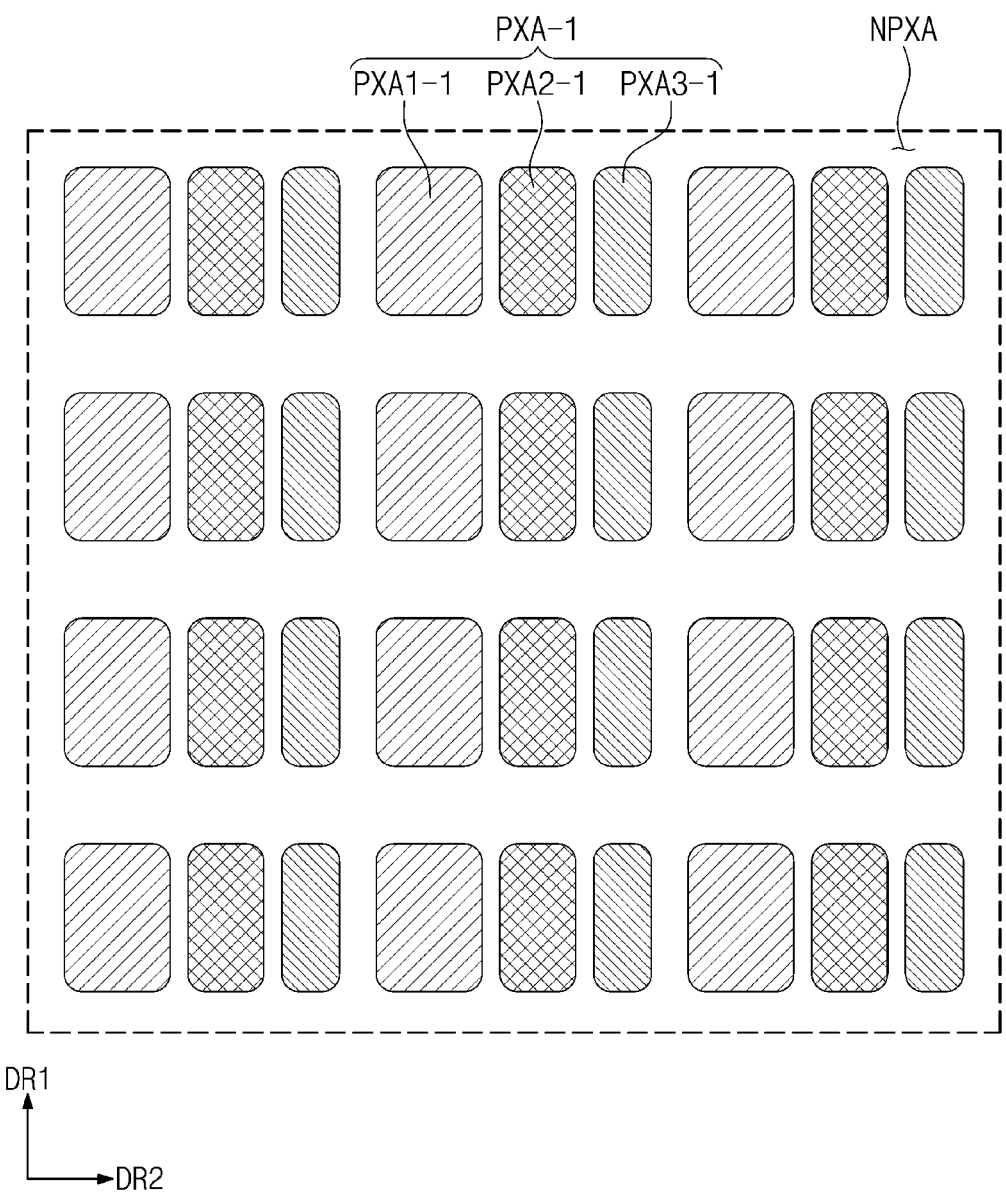
FIGS. 12 and 13 are views showing embodiments of light emitting areas of a display panel constructed according to the principles of the invention.
Figure 13:
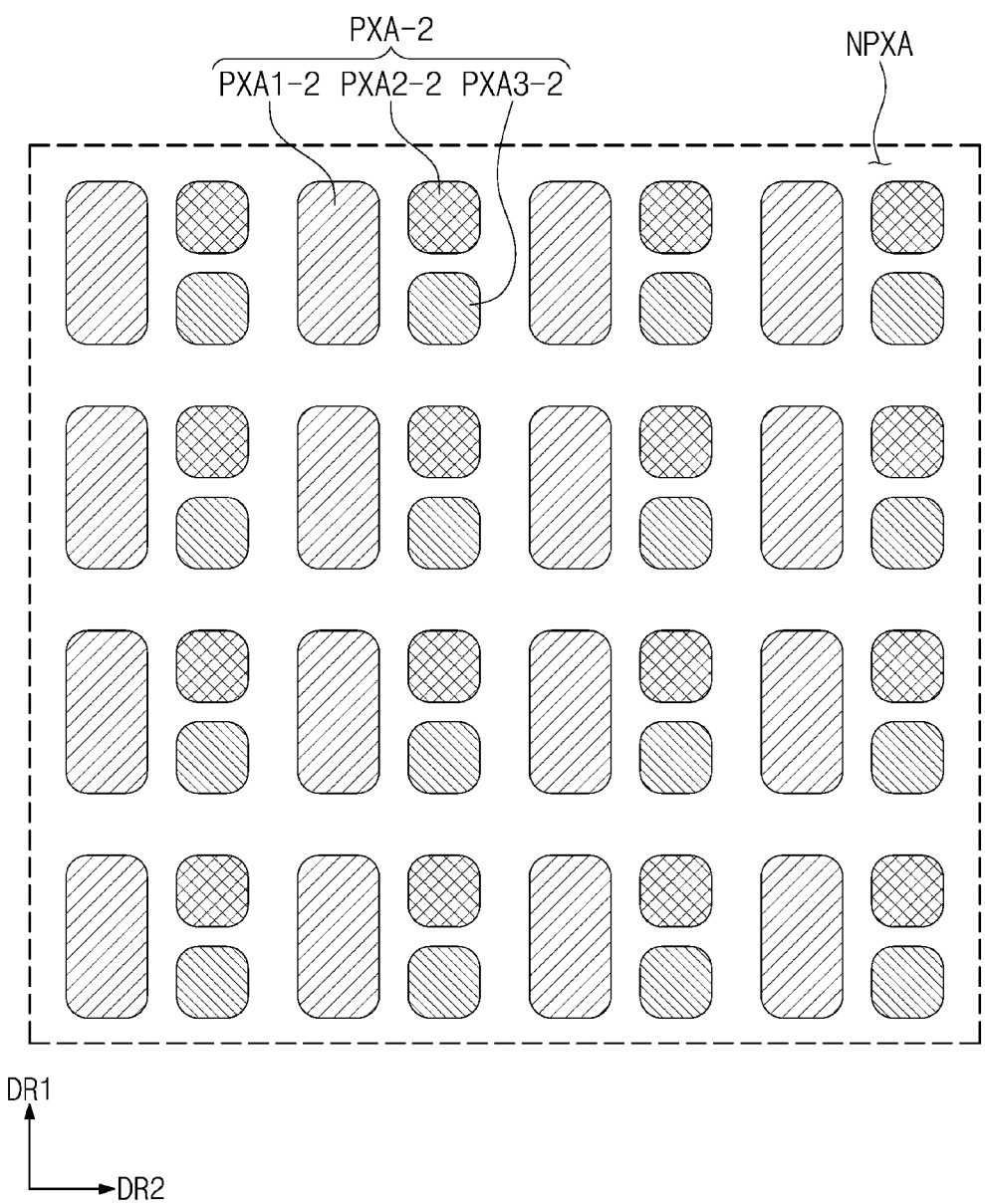

FIGS. 12 and 13 are views showing embodiments of light emitting areas of a display panel constructed according to the principles of the invention.

Referring to FIG. 12, a light emitting area PXA-1 may include a first light emitting area PXA1-1, a second light emitting area PXA2-1, and a third light emitting area PXA3-1.

In the illustrated embodiment, the first light emitting area PXA1-1, the second light emitting area PXA2-1, and the third light emitting area PXA3-1 may be sequentially arranged in the second direction DR2.

In the illustrated embodiment, the first light emitting area PXA1-1 emits a first light having a first wavelength, the second light emitting area PXA2-1 emits a second light having a second wavelength, and the third light emitting area PXA3-1 emits a third light having a third wavelength. The first wavelength is shorter than the second wavelength, and the second wavelength is shorter than the third wavelength. For instance, the first light is a blue light, the second light is a green light, and the third light is a red light. However, according to another embodiment, the wavelengths of the lights respectively emitted from the light emitting areas PXA-1 may be changed.

Referring to FIG. 13, a light emitting area PXA-2 may include a first light emitting area PXA1-2, a second light emitting area PXA2-2, and a third light emitting area PXA3-2.

In the illustrated embodiment, the first light emitting area PXA1-2 has a shape in which a length in the first direction DR1 thereof is longer than a length in the second direction DR2 thereof. The second light emitting area PXA2-2 and the third light emitting area PXA3-2 are arranged in the first direction DR1 to be adjacent to one side of the first light emitting area PXA1-2.

In an embodiment, the first light emitting area PXA1-2 emits a first light having a first wavelength, the second light emitting area PXA2-2 emits a second light having a second wavelength, and the third light emitting area PXA3-2 emits a third light having a third wavelength. The first wavelength is shorter than the second wavelength, and the second wavelength is shorter than the third wavelength. For instance, the first light is a blue light, the second light is a green light, and the third light is a red light. However, according to another embodiment, the wavelengths of the lights respectively emitted from the light emitting areas PXA-2 may be changed.

The lines SLn, SLn+1, PL-R, RL, and PL-S (refer to FIG. 11) of the input sensing circuit FPS may be disposed in the non-light emitting area NPXA shown in FIGS. 12 and 13. In addition, the transparent electrode ED-T (refer to FIG. 10C) may be disposed to overlap with at least a portion of the light emitting areas PXA-1 and PXA-2 shown in FIGS. 12 and 13.

Figure 14:
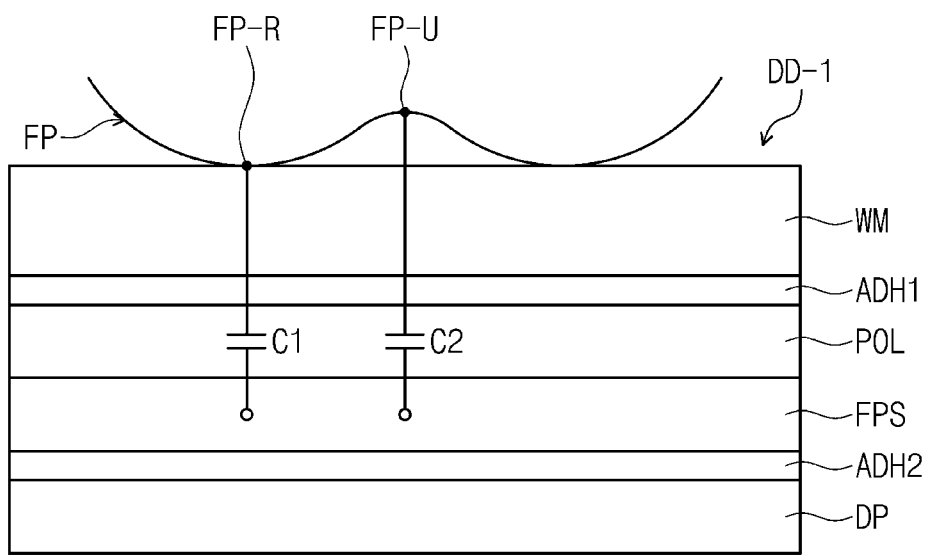
FIG. 14 is a cross-sectional view showing a portion of another embodiment of a display device constructed according to the principles of the invention.

FIG. 14 is a cross-sectional view showing a portion of another embodiment of a display device DD-1 constructed according to the principles of the invention.

The display device DD-1 may include a window WM, an anti-reflection member POL, an input sensing circuit FPS, and a display panel DP. The anti-reflection member POL is disposed under the window WM, the input sensing circuit FPS is disposed under the anti-reflection member POL, and the display panel DP is disposed under the input sensing circuit FPS.

The window WM and the anti-reflection member POL may be attached to each other by a first adhesive member ADH-1.

Other elements of the display device DD-1 have substantially the same structure and function as those of the display device DD described with reference to FIG. 3, and thus details thereof will be omitted to avoid redundancy.

Figure 15:
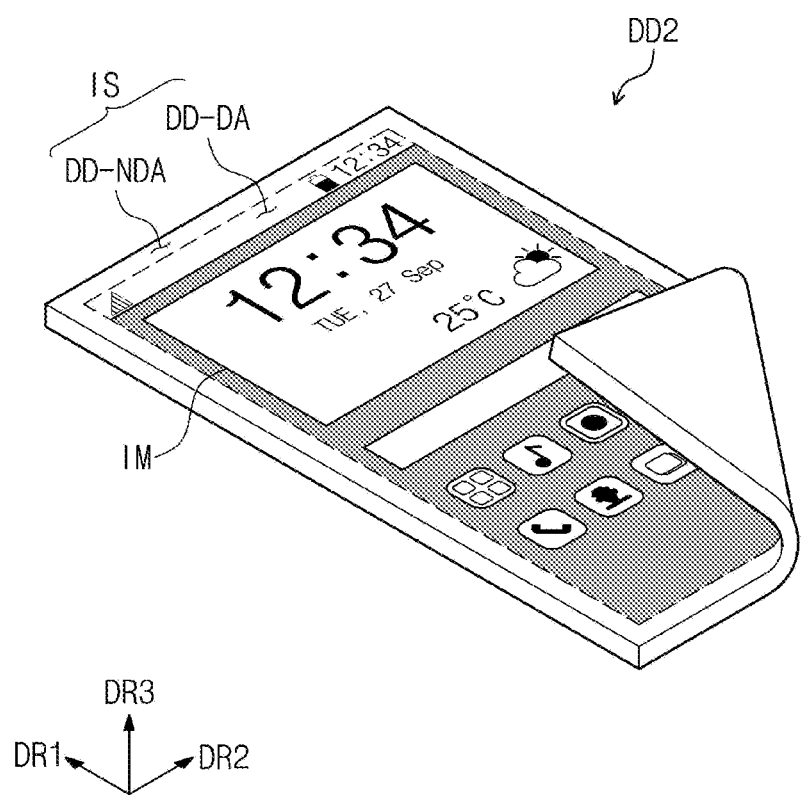
FIGS. 15 and 16 are perspective views of display devices according to other embodiments.
Figure 16:
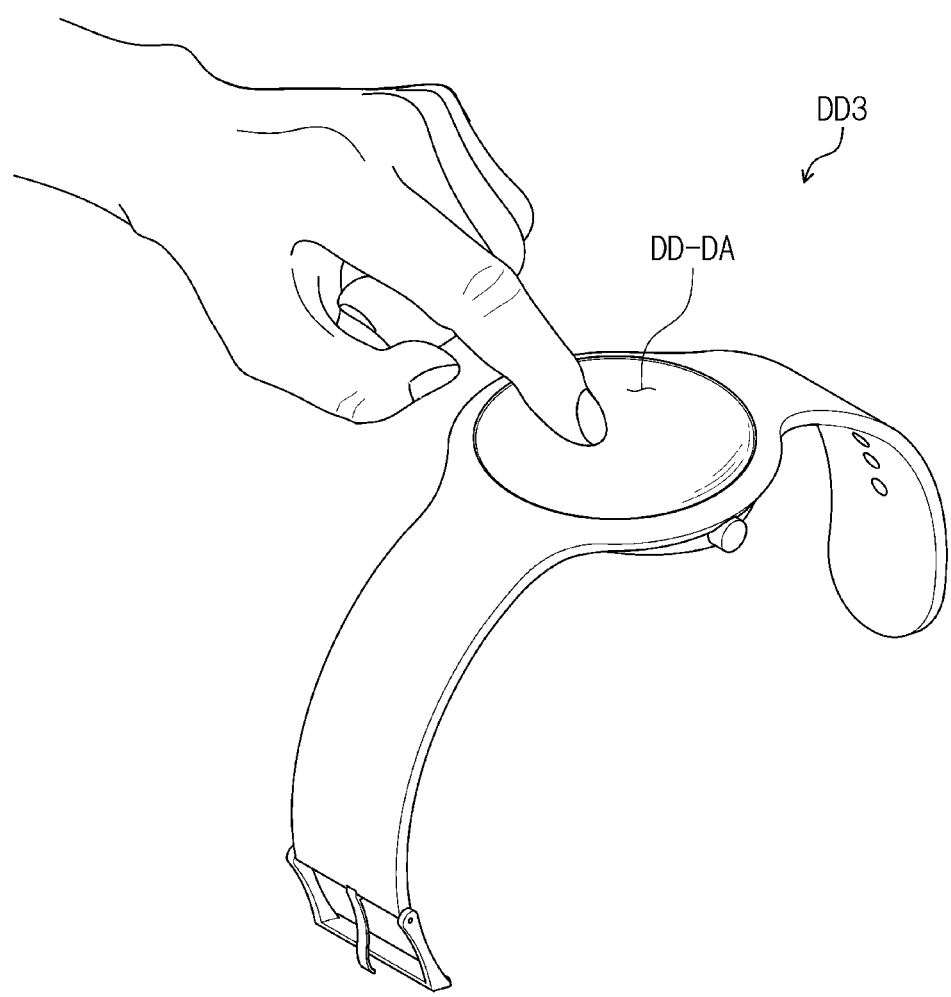

FIGS. 15 and 16 are perspective views of display devices DD2 and DD3 according to other embodiments.

Referring to FIG. 15, the display device DD2 may be partially or entirely bent or rolled.

Referring to FIG. 16, the display device DD3 may be, but not limited to, a wearable device worn on a part of the body. FIG. 16 shows a watch-type device as a representative example, but the display device DD3 should not be limited to the watch-type device. That is, the display device DD3 may have various shapes as long as the display device DD3 is worn on the user's body.

Although certain embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display module comprising:
a display panel having a plurality of light emitting areas, each of the light emitting areas including a first light emitting area to emit first light having a first wavelength, a second light emitting area to emit second light having a second wavelength greater than the first wavelength, and a third light emitting area to emit third light having a third wavelength greater than the second wavelength; and
a circuit disposed on the display panel and configured to sense input signals, said circuit having a first scan line, a second scan line, a readout line, and a sensor, the sensor comprising:
a first transistor having a first input electrode to receive a power source voltage, a first output electrode connected to the readout line, and a first control electrode connected to a first node;
a second transistor having a second input electrode configured to receive an initialization voltage, a second output electrode connected to the first node, and a second control electrode connected to the second scan line;
a first electrode connected to the first scan line and spaced apart from the first light emitting areas, the second light emitting areas, and the third light emitting areas; and
a transparent electrode comprising a first portion overlapped with the first electrode to form a reference capacitor and a second portion connected to the first node,
wherein the second portion of the transparent electrode overlaps with at least two of the light emitting areas, and
wherein the first scan line and second scan line extend in a zigzag shape, the first electrode is branched from the first scan line to have the zigzag shape.

2. The display module of claim 1, wherein the transparent electrode comprises a second electrode overlapping the first electrode and a third electrode overlapping the first, second, and third light emitting areas, and
wherein the circuit further comprises a reference capacitor including the first electrode and the second electrode.

3. The display module of claim 2, wherein the third electrode is configured to form a capacitance with an external object.

4. The display module of claim 1, wherein the transparent electrode is configured to form a capacitance with a fingerprint of a finger.

5. The display module of claim 4, wherein the sensor is provided in a plural number, the transparent electrode of one sensor among the sensors forms a first capacitance with a ridge of the fingerprint, the transparent electrode of another sensor among the sensors forms a second capacitance with a valley of the fingerprint, and the circuit is configured to sense the first capacitance and the second capacitance and to output a signal to recognize the fingerprint.

6. The display module of claim 5, wherein a first scan signal is applied to the first scan line during a first period, and a second scan signal is applied to the second scan line during a second period.

7. The display module of claim 6, wherein the second period is a period after the first period.

8. The display module of claim 1, wherein the first electrode is disposed closer to the first light emitting area than the second light emitting area and the third light emitting area.

9. The display module of claim 1, further comprising a scan driving circuit connected to the first scan line and the second scan line.

10. The display module of claim 1, further comprising an anti-reflection member disposed between the display panel and the circuit.

11. The display module of claim 10, wherein the anti-reflection member is a polarizing member.

12. The display module of claim 1, wherein the readout line extends in the zigzag shape.

13. The display module of claim 1, wherein the first light is a blue light, the second light is a green light, and the third light is a red light.

* * * * *